(12) United States Patent
Oh et al.

(10) Patent No.: US 9,196,827 B2
(45) Date of Patent: Nov. 24, 2015

(54) NON-VOLATILE MEMORY DEVICES HAVING DUAL HEATER CONFIGURATIONS AND METHODS OF FABRICATING THE SAME

(75) Inventors: Gyu-Hwan Oh, Hwaseong-si (KR); Doo-Hwan Park, Yongin-si (KR); Young-Kuk Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 681 days.

(21) Appl. No.: 13/547,663

(22) Filed: Jul. 12, 2012

(65) Prior Publication Data

US 2013/0126510 A1    May 23, 2013

(30) Foreign Application Priority Data

Nov. 23, 2011 (KR) ........................ 10-2011-0123076

(51) Int. Cl.
| | |
|---|---|
| H05B 3/00 | (2006.01) |
| H01L 45/00 | (2006.01) |
| H05B 3/14 | (2006.01) |
| H01L 27/02 | (2006.01) |
| H01L 27/102 | (2006.01) |
| H01L 27/24 | (2006.01) |

(52) U.S. Cl.
CPC ........ *H01L 45/1233* (2013.01); *H01L 27/0296* (2013.01); *H01L 27/1021* (2013.01); *H01L 27/2409* (2013.01); *H01L 45/06* (2013.01); *H01L 45/126* (2013.01); *H01L 45/1246* (2013.01); *H01L 45/145* (2013.01); *H01L 45/1683* (2013.01); *H05B 3/141* (2013.01)

(58) Field of Classification Search
CPC ............ H01L 27/0296; H01L 27/1021; H01L 27/2409; H01L 45/06; H01L 45/1246; H01L 45/126; H01L 45/145; H01L 45/1683; H01L 45/1233; H05B 3/141
See application file for complete search history.

(56) References Cited

U.S. PATENT DOCUMENTS

| | | | |
|---|---|---|---|
| 7,042,001 | B2 | 5/2006 | Kim et al. |
| 7,723,716 | B2 | 5/2010 | Choi |
| 7,738,290 | B2 | 6/2010 | Nakai |
| 2007/0187801 | A1 | 8/2007 | Asao et al. |
| 2009/0283739 | A1* | 11/2009 | Kiyotoshi .................. 257/4 |

FOREIGN PATENT DOCUMENTS

| | | |
|---|---|---|
| JP | 2007-214419 | 8/2007 |
| JP | 2008-218492 | 9/2008 |
| KR | 10-2005-0078273 A | 8/2005 |
| KR | 10-0660287 B1 | 12/2006 |

\* cited by examiner

*Primary Examiner* — Shawntina Fuqua
(74) *Attorney, Agent, or Firm* — Myers Bigel Sibley & Sajovec, PA

(57) ABSTRACT

A non-volatile memory device includes a data storage structure coupled between first and second conductive lines of the memory device. The data storage structure includes a conductive lower heater element, a data storage pattern, and a conductive upper heater element sequentially stacked. At least one sidewall surface of the data storage pattern is coplanar with a sidewall surface of the upper heater element thereabove and a sidewall surface of the lower heater element therebelow. Related fabrication methods are also discussed.

20 Claims, 39 Drawing Sheets

US 9,196,827 B2

NON-VOLATILE MEMORY DEVICES HAVING DUAL HEATER CONFIGURATIONS AND METHODS OF FABRICATING THE SAME

CROSS-REFERENCE TO RELATED APPLICATION

This application claims priority under 35 U.S.C. §119 to Korean Patent Application No. 10-2011-0123076 filed on Nov. 23, 2011, the disclosure of which is hereby incorporated by reference herein its entirety.

BACKGROUND

Embodiments of the inventive concept relate to memory devices, and more particularly, to non-volatile memory devices and methods of fabricating the same.

Research into various methods for reducing a reset current in non-volatile memory devices, such as phase-change random access memories (PRAMs), has been conducted.

SUMMARY

Embodiments of the inventive concept provide a non-volatile memory device having a low reset current.

Other embodiments of the inventive concept provide methods of fabricating a non-volatile memory device having a low reset current.

The technical objectives of the inventive disclosure are not limited to the above disclosure; other objectives may become apparent to those of ordinary skill in the art based on the following descriptions.

In accordance with some embodiments of the inventive concept, a non-volatile memory device includes a data storage structure coupled between first and second conductive lines of the memory device. The data storage structure includes a conductive lower heater element, a data storage pattern, and a conductive upper heater element sequentially stacked. A sidewall surface of the data storage pattern is coplanar with a sidewall surface of the upper heater element and a sidewall surface of the lower heater element.

In some embodiments, a contact area between the upper heater element and the data storage pattern may be substantially equal to a contact area between the lower heater element and the data storage pattern.

In some embodiments, a surface of the lower heater element contacting the data storage pattern may include a protrusion along an edge thereof. A surface of the data storage pattern contacting the upper heater element may include a protrusion along an edge thereof.

In some embodiments, a first insulating pattern may include a planar surface that contacts the sidewall surfaces of the lower heater element, the data storage pattern, and the upper heater element.

In some embodiments, the data storage pattern, the upper heater element, and the lower heater element may include respective second sidewall surfaces opposite the respective first sidewall surfaces thereof. The second sidewall surface of the data storage pattern may be coplanar with the second sidewall surface of the upper heater element and the second sidewall surface of the lower heater element.

In some embodiments, a second insulating pattern may include a planar surface that contacts the second sidewall surfaces of the lower heater element, the data storage pattern, and the upper heater element. The first and second insulating patterns may define a trench therebetween including the data storage structure therein.

In some embodiments, the data storage pattern, the upper heater element, and the lower heater element may respectively include third and fourth opposing sidewall surfaces. The third sidewall surfaces of the data storage pattern, the upper heater element, and the lower heater element may be coplanar, and the fourth sidewall surfaces of the data storage pattern, the upper heater element, and the lower heater element may be coplanar. Respective insulating lines may extend along the third and fourth sidewall surfaces of the data storage pattern, the upper heater element, and the lower heater element.

In some embodiments, at least one of the lower heater element or the upper heater element comprises a first portion including the sidewall surface thereof extending in a direction substantially perpendicular to a surface of an active region thereon, and a second portion extending in a direction substantially parallel to the surface of the active region.

In some embodiments, an upper conductive electrode may be provided between the upper heater element and the second conductive line. The upper conductive electrode may have a lower electrical resistance than the upper heater element and a higher electrical resistance than the second conductive line.

In some embodiments, a diode element may be provided between the first conductive line and the lower heater element, and a lower conductive pad may be provided between the diode element and the lower heater element. A contact area between the lower conductive pad and the lower heater element may not be less than a contact area between the lower conductive pad and the diode element.

In some embodiments, first and second opposing sidewall surfaces of the lower conductive pad may be coplanar with sidewall surfaces of the first and second insulating patterns, respectively.

In some embodiments, an upper surface and a sidewall surface of the upper heater element may electrically contact the second conductive line.

In accordance with an aspect of the inventive concept, a non-volatile semiconductor device is provided. The device includes a first conductive line disposed on a substrate, a switching element disposed on the first conductive line, a lower heater disposed on the switching element, a data storage pattern disposed on the lower heater, an upper heater disposed on the data storage pattern, and a second conductive line disposed on the upper heater. A lateral surface of the upper heater is vertically aligned with a lateral surface of the lower heater and a lateral surface of the data storage pattern.

A contact surface between the upper heater and the data storage pattern may be (substantially) the same size as a contact surface between the lower heater and the data storage pattern.

A vertical length of the upper heater may be greater than a horizontal width thereof.

A vertical length of the upper heater may be greater than a vertical length of the lower heater.

The lower heater, the data storage pattern, and the upper heater may have (substantially) the same horizontal width.

An edge of a top surface of the lower heater may protrude upward, and an edge of a top surface of the data storage pattern may protrude upward.

A vertical length of the data storage pattern may be greater than a horizontal width thereof.

The data storage pattern may be bar-shaped.

The second conductive line may be in contact with top and lateral surfaces of the upper heater.

The device may further include an upper electrode interposed between the upper heater and the second conductive line. The upper electrode may be in contact with top and lateral surfaces of the upper heater.

The device may further include a conductive pattern interposed between the switching element and the lower heater. The lower heater may include an upper part having a vertical height greater than a horizontal width thereof, and a lower part having a horizontal width greater than a vertical height thereof. The lower part of the lower heater may be in contact with the conductive pattern.

In accordance with another aspect of the inventive concept, a non-volatile semiconductor device is provided. The device includes a first conductive line disposed on a substrate, a switching element disposed on the first conductive line, a lower heater disposed on the switching element, a data storage pattern disposed on the lower heater, a high-resistance pattern disposed on the data storage pattern, an intermediate resistance pattern disposed on the high-resistance pattern, and a second conductive line formed on the intermediate resistance pattern and crossing the first conductive line. A lateral surface of the high-resistance pattern is vertically aligned on a lateral surface of the lower heater and a lateral surface of the data storage pattern. The high-resistance pattern includes a material having a higher electrical resistance than that of the second conductive line. The intermediate resistance pattern includes a material having an electrical resistance higher than that of the second conductive line, and lower than that of the high-resistance pattern.

The high-resistance pattern may include titanium silicon nitride (TiSiN), the intermediate resistance pattern may include TiN, and the second conductive line may include copper (Cu).

The intermediate resistance pattern may include an upper electrode in contact with the high-resistance pattern and a barrier metal pattern formed on the upper electrode and surrounding lateral and bottom surfaces of the second conductive line.

In some embodiments, a method of fabricating a non-volatile memory device includes forming a data storage layer on a conductive lower heater element in a trench defined by at least one insulating pattern. The lower heater element may be formed by recessing a conductive lower heater layer in the trench. The data storage layer is recessed to define a data storage pattern in the trench contacting the lower heater element. A conductive upper heater element is formed in the trench contacting the data storage pattern opposite the lower heater element.

Specific particulars of other embodiments are included in detailed descriptions and drawings.

BRIEF DESCRIPTION OF THE DRAWINGS

The foregoing and other features and advantages of the inventive concepts will be apparent from the more particular description of embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF THE EMBODIMENTS

Figure 1:
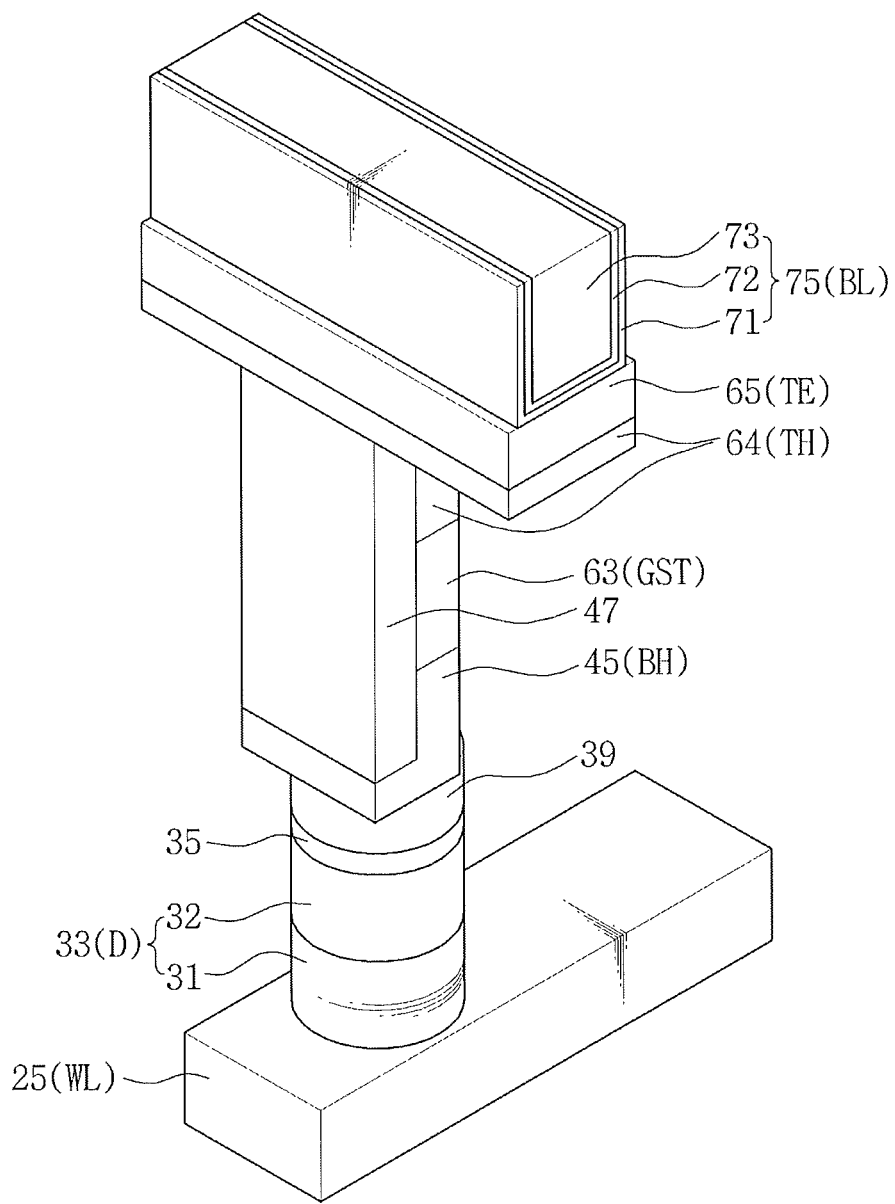
FIG. 1 is a perspective view of main components of a non-volatile memory device according to some embodiments of the inventive concept.

The present inventive concept will now be described more fully with reference to the accompanying drawings, in which exemplary embodiments of the inventive concept are shown. The inventive concept may, however, be embodied in many different forms and should not be construed as being limited to the embodiments set forth herein; rather, these embodiments are provided so that this disclosure will be thorough and complete, and will fully convey the concept of the inventive concept to those skilled in the art. In the drawings, the thicknesses of layers and regions are exaggerated for clarity. It will also be understood that when a layer is referred to as being "on" another layer or substrate, it can be directly on the other layer or substrate, or intervening layers may also be present. Like numbers refer to like elements throughout.

It will be understood that, although the terms first, second, etc. may be used herein to describe various elements, components, regions, layers and/or sections, these elements, components, regions, layers and/or sections should not be limited by these terms. Thus, a first element, component, region, layer or section discussed below could be termed a second element, component, region, layer or section without departing from the teachings of the inventive concept.

Spatially relative terms, such as "top end", "bottom end", "top surface", "bottom surface", "upper", "lower", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the inventive concept are described herein with reference to cross-section illustrations that are schematic illustrations of idealized embodiments (and intermediate structures) of the inventive concept. As such, variations from the shapes of the illustrations as a result, for example, of manufacturing techniques and/or tolerances, are to be expected. Thus, embodiments of the inventive concept should not be construed as limited to the particular shapes of regions illustrated herein but are to include deviations in shapes that result, for example, from manufacturing. In other words, the regions illustrated in the figures are schematic in nature and their shapes are not intended to illustrate the actual shape of a region of a device and are not intended to limit the scope of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Figure 2:
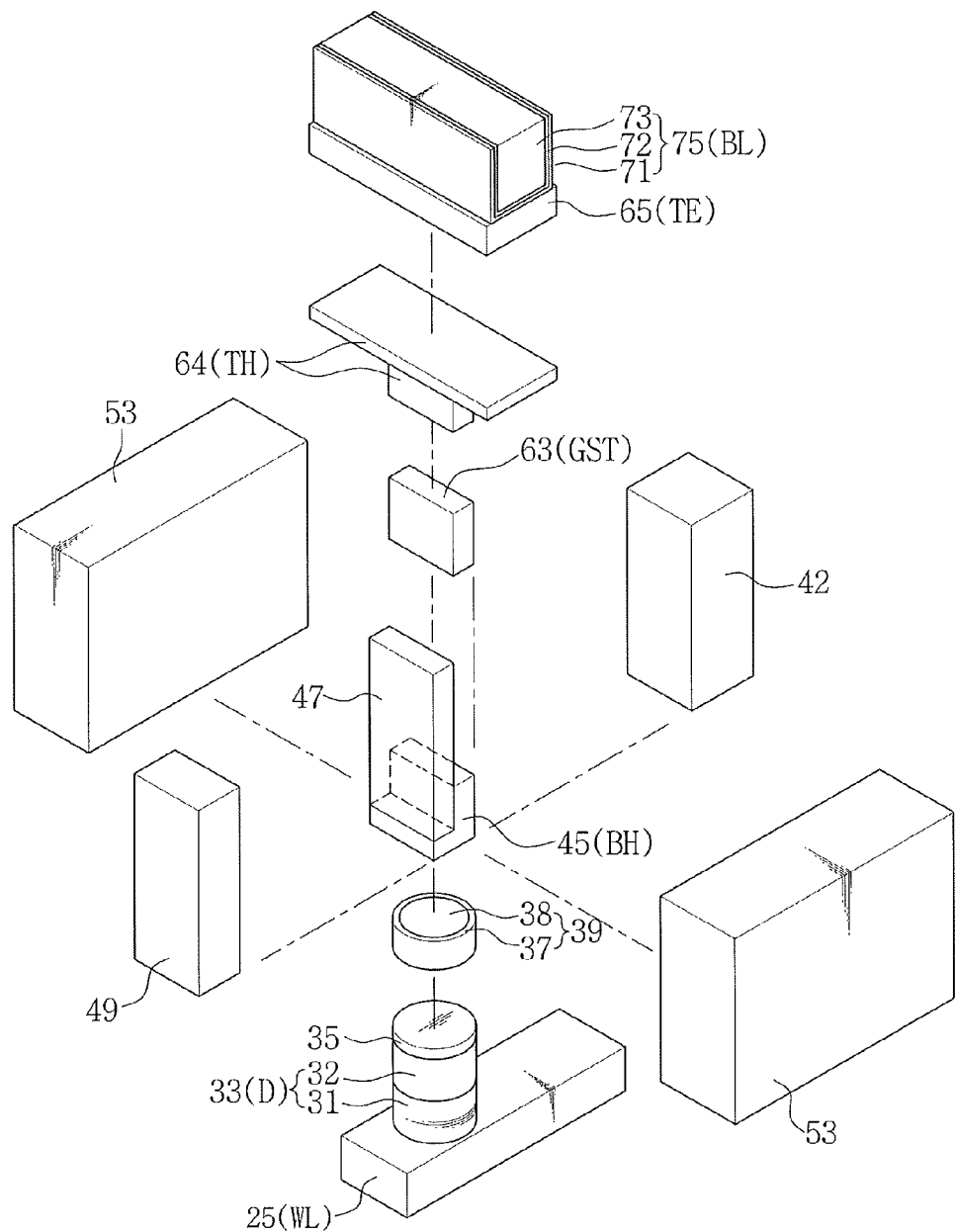
FIG. 2 is an exploded perspective view of FIG. 1.
Figure 3:
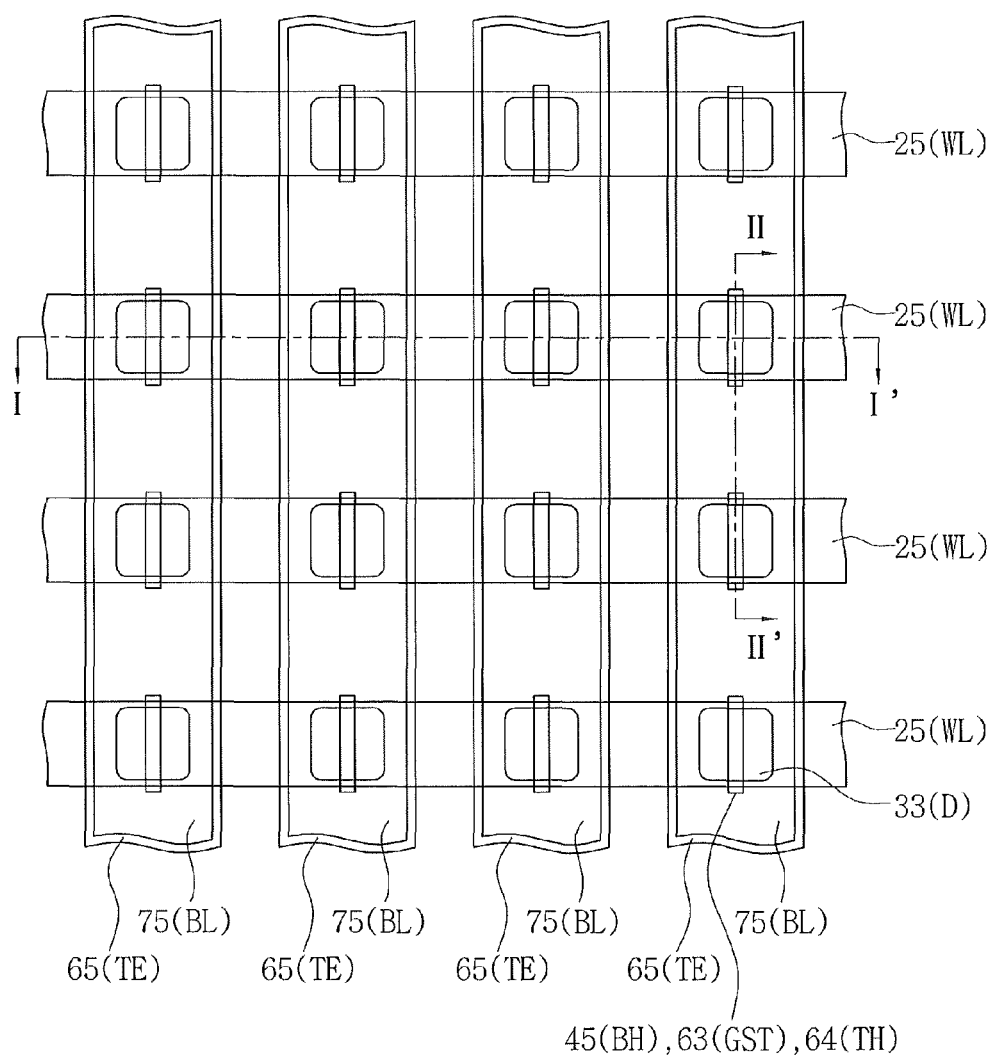
FIG. 3 is a layout illustrating the non-volatile memory device shown in FIG. 1.
Figure 4:
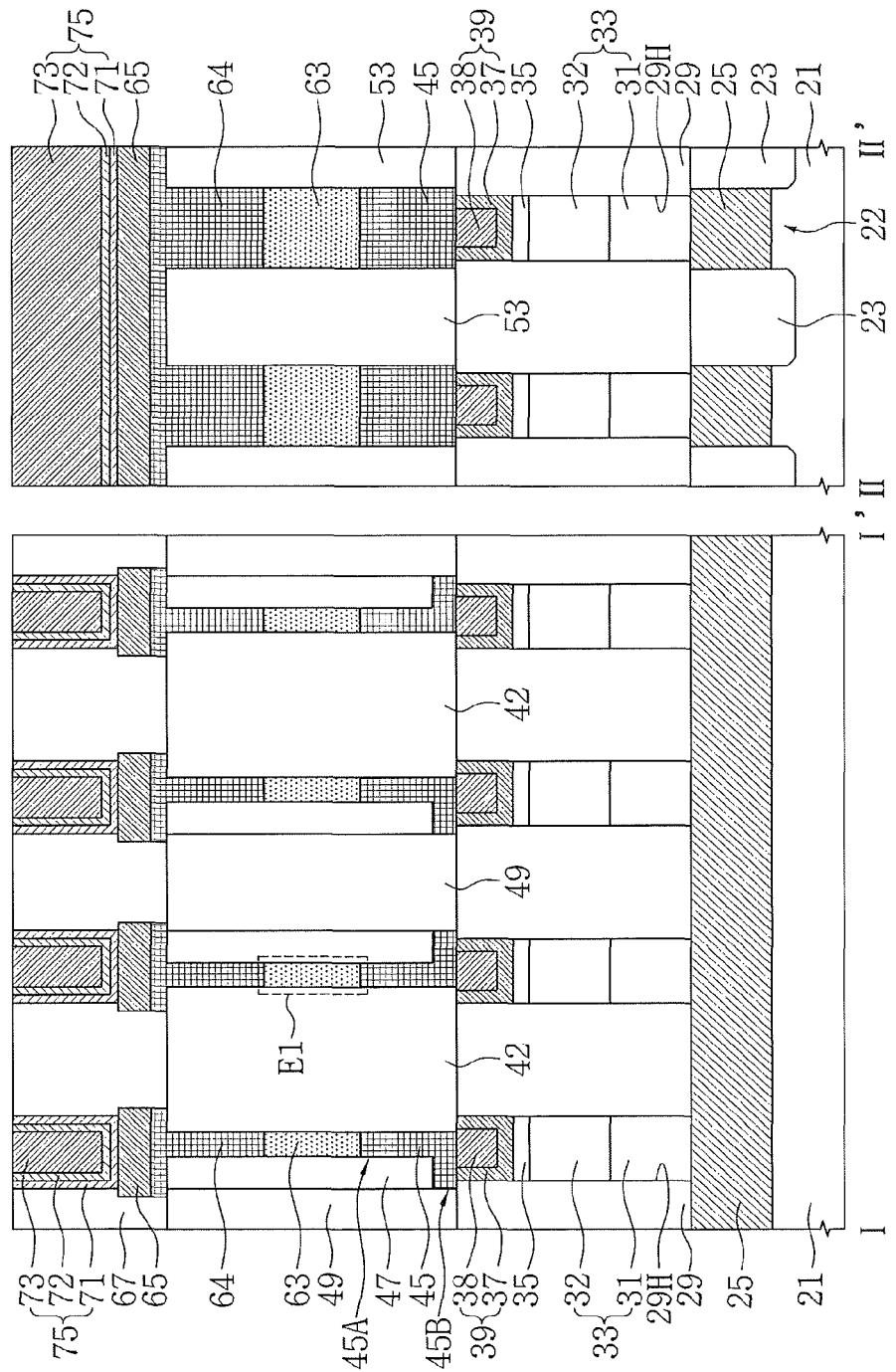
FIG. 4 is a cross-sectional view taken along lines I-I' and II-II' of FIG. 3.
Figure 5:
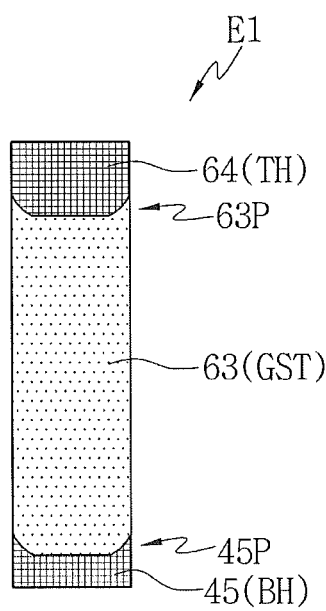
FIG. 5 is a detailed partial enlarged view of a portion of FIG. 4.

FIG. 1 is a perspective view of some components of a non-volatile memory device according to some embodiments of the inventive concept. FIG. 2 is an exploded perspective view for facilitating the understanding of FIG. 1. FIG. 3 is a layout illustrating the non-volatile memory device shown in FIG. 1. FIG. 4 is a cross-sectional view taken along lines I-I' and II-II' of FIG. 3. FIG. 5 is a detailed partial enlarged view of a portion of FIG. 4. FIGS. 6 through 9 are cross-sectional views taken along lines I-I' and II-II' of FIG. 3, which illustrate a non-volatile memory device according to some applied embodiments of the inventive concept.

Referring to FIGS. 1 and 2, a diode (D) 33 may be formed on a word line (WL) 25. The diode 33 may include a first semiconductor pattern 31 and a second semiconductor pattern 32 stacked sequentially. A metal silicide pattern 35 may be formed on the diode 33. A lower pad 39 may be formed on the metal silicide pattern 35. The lower pad 39 may include a first barrier metal pattern 37 and a conductive pattern 38 stacked sequentially. The barrier metal pattern 37 may extend along a sidewall or perimeter of the conductive pattern 38 in some embodiments. A lower or bottom heater (BH) 45 may be formed on the lower pad 39. A data storage pattern 63 may be formed on the lower heater 45. The data storage pattern 63 may include a phase changeable material that is configured to be switched between amorphous and crystalline states or phases in response to heat, for example, as provided by the heaters 45 and/or 64 described herein. The phase changeable material may be a compound including at least one chalcogenide element, such as Te and Se, and/or at least one of Ge, Sb, Bi, Pb, Sn, Ag, As, S, Si, P, O, or N. For example, the data storage pattern 63 may be formed of Germanium-Antimony-Tellurium (GST) or another phase change material in some embodiments. The data storage pattern 63 may be dash- or bar-shaped. An upper or top heater (TH) 64 may be formed on the data storage pattern 63. The conductive lower heater 45, the data storage pattern 63, and the conductive upper heater 64, which are sequentially stacked, may collectively define a data storage structure. An upper or top electrode (TE) 65 may be formed on the upper heater 64. A bit line (BL) 75 may be formed on the upper electrode 65. The bit line 75 may include a second barrier metal pattern 71, a seed layer 72, and a bit conductive layer 73.

A spacer 57 may be formed on one lateral surface of the lower heater 45, one lateral surface of the data storage pattern 63, and one lateral surface of the upper heater 64. A first insulating pattern 42, a second insulating pattern 49, and a pair of insulating lines 53 may be formed to surround the lower heater 45, the data storage pattern 63, the upper heater 64, and the spacer 47. The pair of insulating lines 53 may be parallel to each other. The first and second insulating patterns 42 and 49 may be formed spaced apart from each other between the pair of insulating lines 53. The lower heater 45, the data storage pattern 63, the upper heater 64, and the spacer 47 may be formed between the first and second insulating patterns 42 and 49.

The metal silicide pattern 35 may be self-aligned on the diode 33. The metal silicide pattern 35 may have the same or similar shape as the diode 33. The lower pad 39 may be self-aligned on the metal silicide pattern 35. The lower pad 39 may have the same or similar shape as the metal silicide pattern 35. For example, each of the diode 33, the metal silicide pattern 35, and the lower pad 39 may have a cylindrical shape.

The data storage pattern 63 may be self-aligned on the lower heater 45. The upper heater 64 may be self-aligned on the data storage pattern 63. One lateral or sidewall surface of the lower heater 45, one lateral or sidewall surface of the data storage pattern 63, and one lateral or sidewall surface of the upper heater 64 may be vertically aligned (e.g., coplanar) with one another. The lower heater 45, the data storage pattern 63, and the upper heater 64 may have substantially the same horizontal width. As such, in some embodiments, opposing sidewall surfaces of the data storage pattern 63 may be coplanar with opposing sidewall surfaces of the upper heater 64 above and the lower heater 45 below. In further embodiments, the data storage pattern 63 may include four sidewall surfaces (that is, two pairs of opposing sidewall surfaces), and each of the sidewall surfaces of the data storage pattern 63 may be coplanar with an adjacent one of the sidewall surfaces of the upper heater 64 above and the lower heater 45 below. A contact surface between the data storage pattern 63 and the lower heater 45 may be substantially the same size (e.g., may have a substantially equal surface area) as a contact surface between the data storage pattern 63 and the upper heater 64.

The upper heater 64 may include a material having substantially the same electrical resistance as the lower heater 45. The upper heater 64 may further include the same material as the lower heater 45 in some embodiments. The bit conductive layer 73 may include a low-resistance material. The bit conductive layer 73 may exhibit a lower electrical resistance than the upper heater 64. The upper electrode 65 may include an intermediate resistance material. The upper electrode 65 may exhibit an electrical resistance lower than that of the upper heater 64, and higher than that of the bit conductive layer 73. For example, the upper heater 64 may include titanium silicon nitride (TiSiN), the upper electrode 65 may include TiN, and the bit conductive layer 73 may include copper (Cu).

In some applications, the word line 25 may correspond to a first conductive line, the bit line 75 may correspond to a second conductive line, the upper heater 64 may correspond to a high-resistance pattern, and the upper electrode 65 and the second barrier metal pattern 71 may correspond to an intermediate resistance pattern. In other embodiments, the upper heater 64 may include a material having a different electrical resistance from the lower heater 45.

As described above, the non-volatile memory device according to some embodiments of the inventive concept may include the lower heater 45, the data storage pattern 63, and the upper heater 64. The lower heater 45 and the upper heater 64 may constitute or define a dual heater. The configuration of the lower and upper heaters 45 and 64 may exhibit rapid, efficient heat emission/transmission characteristics. Also, the lower heater 45, the data storage pattern 63, and the upper heater 64 may be surrounded with the spacer 47, the first insulating pattern 42, the second insulating pattern 49, and the pair of insulating lines 53 at sidewalls thereof. The spacer 47, the first insulating pattern 42, the second insulating pattern 49, and the pair of insulating lines 53 may have excellent adiabatic effects. Thus, a memory cell having a low reset current may be embodied. Accordingly, non-volatile memory devices according to embodiments of the inventive concept can exhibit improved electrical properties as compared to traditional heater arrangements.

Referring to FIG. 3, word lines 25 may be formed on a cell array region of the non-volatile memory device and aligned parallel to one another. Upper electrodes 65 may be formed over and across the word lines 25. Bit lines 75 may be formed on the upper electrodes 65. The bit lines 75 may cross the word lines 25 at right angles. Diodes 33, lower heaters 45, data storage patterns 63, and upper heaters 64 may be formed at intersections between the word lines 25 and the bit lines 75.

Referring to FIGS. 3 and 4, an element isolation layer 23 may be formed on predetermined regions of a substrate 21 to define active regions 22. Word lines 25 may be formed on the active regions 22. A molding layer 29 may be formed on the word lines 25 and the element isolation layer 23. Contact holes 29H may be formed through the molding layer 29. A first semiconductor pattern 31, a second semiconductor pattern 32, a metal silicide pattern 35, and a lower pad 39 may be sequentially stacked within each of the contact holes 29H. The first and second semiconductor patterns 31 and 32 may together constitute or define one diode 33. The lower pad 39 may include the conductive pattern 38 and the first barrier metal pattern 37 configured to surround lateral and bottom surfaces of the conductive pattern 38. Top surfaces of the lower pads 39 and the molding layer 29 may be at substantially the same level. The diodes 33, the metal silicide patterns 35, and the lower pads 39 may completely fill the contact holes 29H.

The insulating lines 53 may be formed on the molding layer 29 and spaced apart from each other. The insulating lines 53 may be bar-shaped and may extend parallel to each other. The first insulating patterns 42 and the second insulating patterns 49 may be formed on the molding layer 29 and spaced apart from each other between the insulating lines 53. The first insulating patterns 42 and the second insulating patterns 49 may be alternately formed. The first insulating patterns 42 may partially cover or extend onto the lower pads 39.

The lower heaters 45, the data storage patterns 63, the upper heaters 64, and the spacers 47 may be formed between the first insulating patterns 42 and the second insulating patterns 49. Specifically, each of the lower heaters 45 may include an upper part 45A having a vertical height greater than a horizontal width thereof, and a lower part 45B having a horizontal width greater than a vertical height thereof. For example, each of the lower heaters 45 may be formed in an "L" shape. The lower part 45B of the lower heater 45 may be in contact with the lower pad 39. Each of the data storage patterns 63 may be self-aligned on the upper part 45A of the lower heater 45. The data storage pattern 63 may be vertically aligned on the upper part 45A. Lateral surfaces of the data storage pattern 63 may be vertically aligned on lateral surfaces of the upper part 45A. In other words, at least one sidewall surface of the data storage pattern 63 may be coplanar with at least one sidewall surface of the upper part 45A of the lower heater 45. The data storage pattern 63 may have substantially the same horizontal width as the upper part 45A.

Each of the upper heaters 64 may be self-aligned on the data storage pattern 63. The upper heater 64 may be vertically aligned on the data storage pattern 63. Lateral surfaces of the upper heater 64 may be vertically aligned on lateral surfaces of the data storage pattern 63. In other words, at least one sidewall surface of the data storage pattern 63 may be coplanar with at least one sidewall surface of a lower part of the upper heater 64. At least the lower part of the upper heater 64 may have substantially the same horizontal width as the data storage pattern 63. Each of the spacers 47 may be in contact with a top surface of the lower part 45B, one lateral surface of the upper part 45A, one lateral surface of the data storage pattern 63, and one lateral surface of the upper heater 64. A bottom end region or lower part of the upper heater 64 may have a vertical height greater than a horizontal width thereof. A top end region or upper part of the upper heater 64 may extend on the spacer 47, the first insulating pattern 42, and the second insulating pattern 49. The lower heater 45 may have substantially the same vertical length or height as the upper heater 64.

Upper electrodes 65 may be formed on the upper heaters 64. An upper insulating layer 67 may be formed on the insulating lines 53, the first insulating patterns 42, the second insulating patterns 49, and the upper electrodes 65. Bit lines 75 may be formed through the upper insulating layer 67 and in contact with the upper electrodes 65. Each of the bit lines 75 may include the second barrier metal pattern 71, a seed layer 72, and a bit conductive layer 73 stacked sequentially.

Referring to FIGS. 4 and 5, an edge of a top or upper surface of the lower heater 45 (which contacts the data storage pattern 63) may protrude upward. That is, a first protrusion 45P may be formed along the edge of the top surface of the lower heater 45. For example, the upper surface of the lower heater 45 may be a concave surface. An edge of a top or upper surface of the data storage pattern 63 (which contacts the upper heater 64) may also protrude upward. That is, a second protrusion 63P may be formed along the edge of the top surface of the data storage pattern 63. For example, the upper surface of the data storage pattern 63 may also be a concave surface. The data storage pattern 63 may have a vertical length or height greater than a horizontal width thereof.

Figure 6:
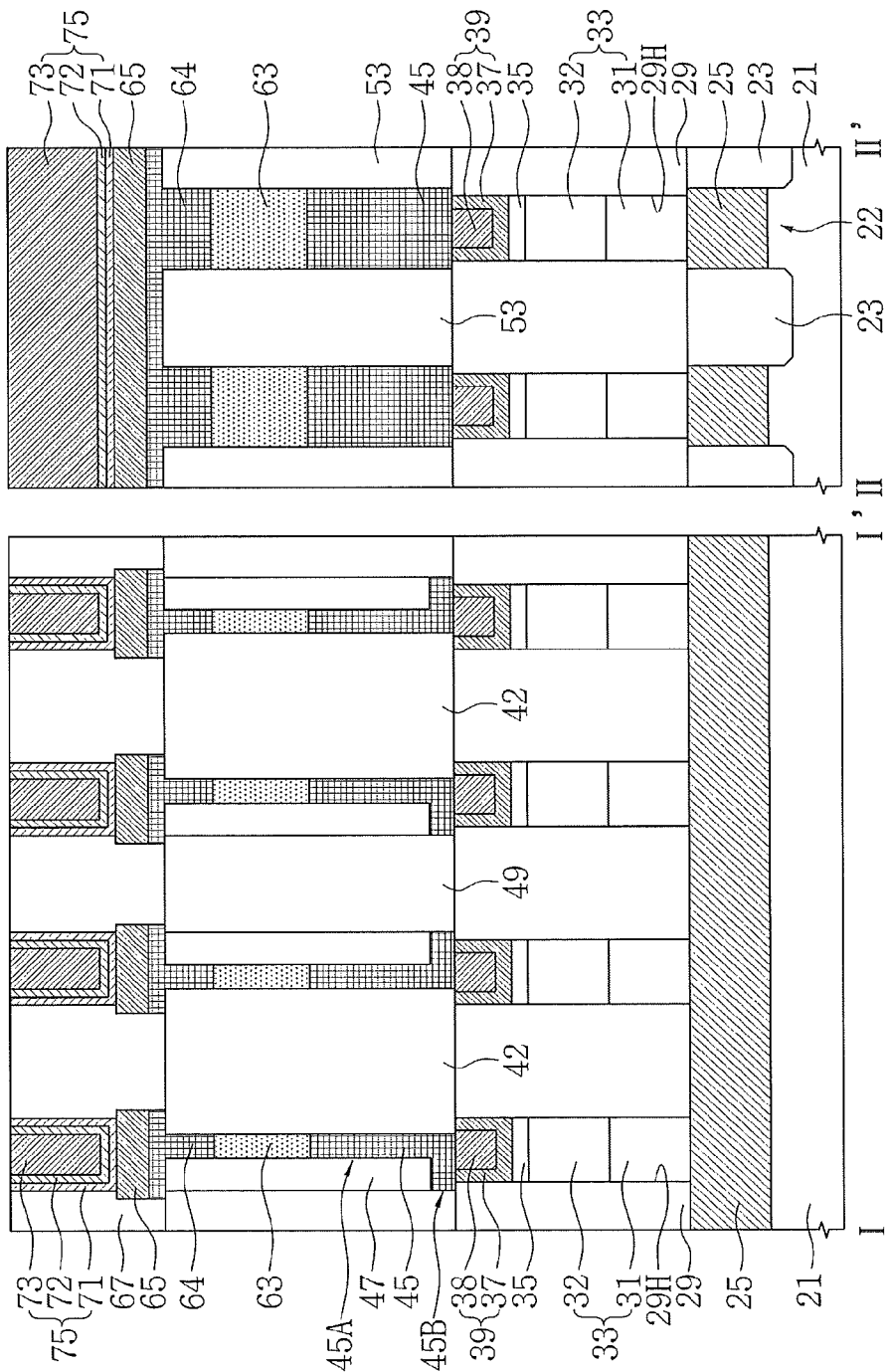
FIGS. 6 through 9 are cross-sectional views taken along lines I-I' and II-II' of FIG. 3, which illustrate a non-volatile memory device according to some embodiments of the inventive concept.

Referring to FIG. 6, the lower heater 45 may have a greater vertical length or height than the upper heater 64 in some embodiments.

Figure 7:
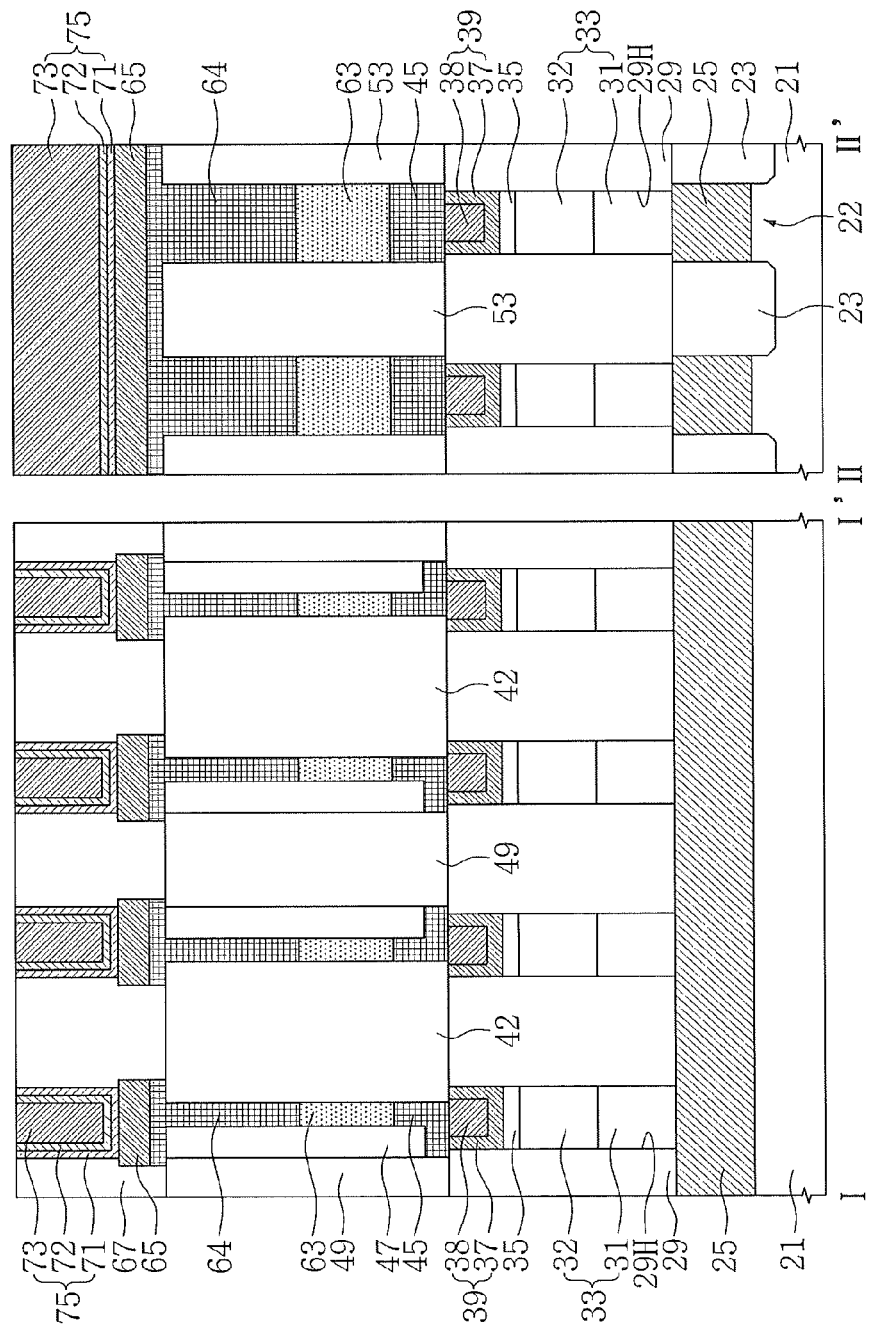

Referring to FIG. 7, the upper heater 64 may have a greater vertical length or height than the lower heater 45.

Figure 8:
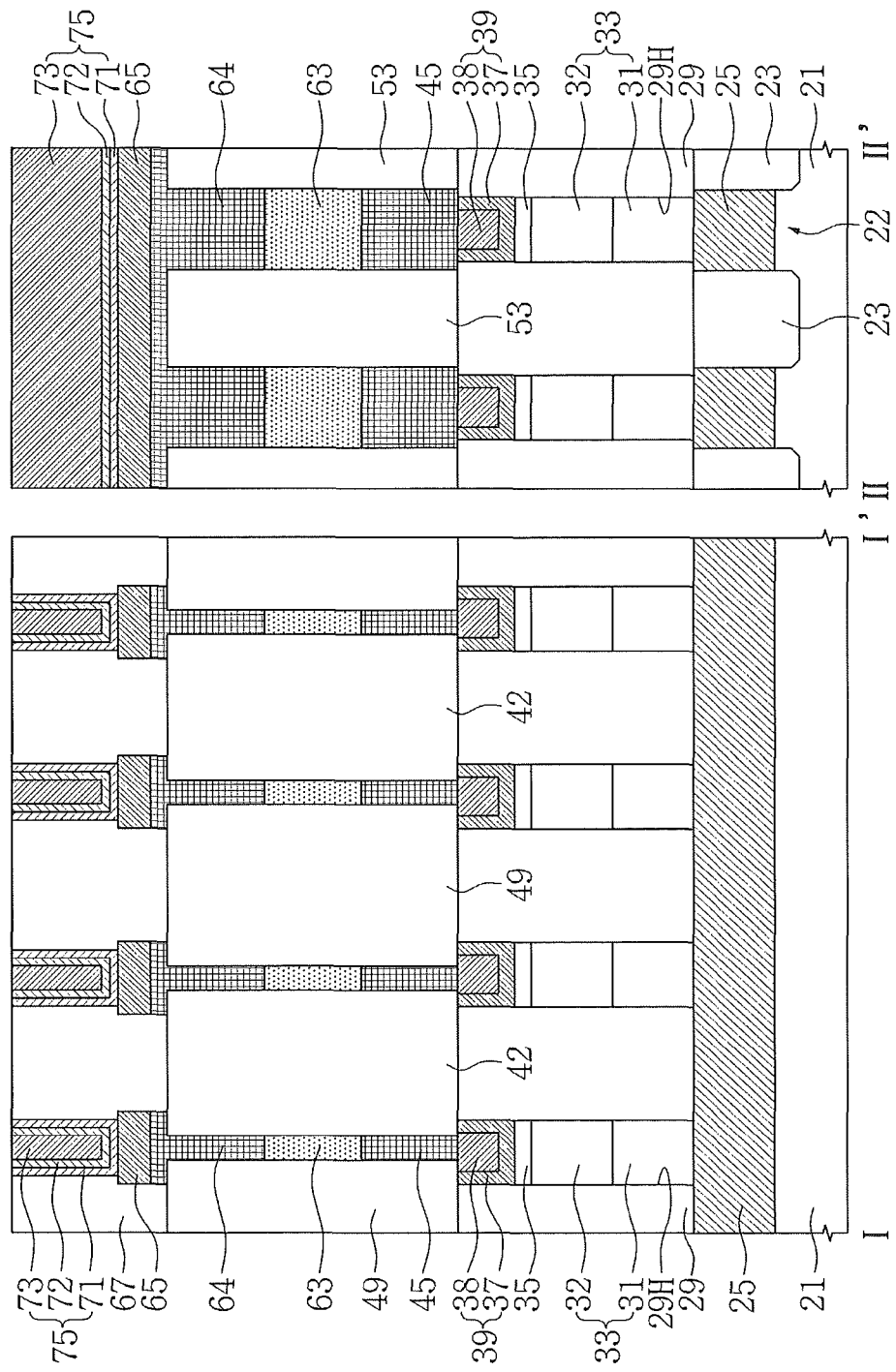

Referring to FIG. 8, each of the lower heaters 45 may be bar-shaped having a vertical length greater than a horizontal width thereof. Lateral surfaces of the lower heaters 45, the data storage patterns 63, and the upper heaters 64 may be in contact with the insulating lines 53, the first insulating patterns 42, and the second insulating patterns 49.

Figure 9:
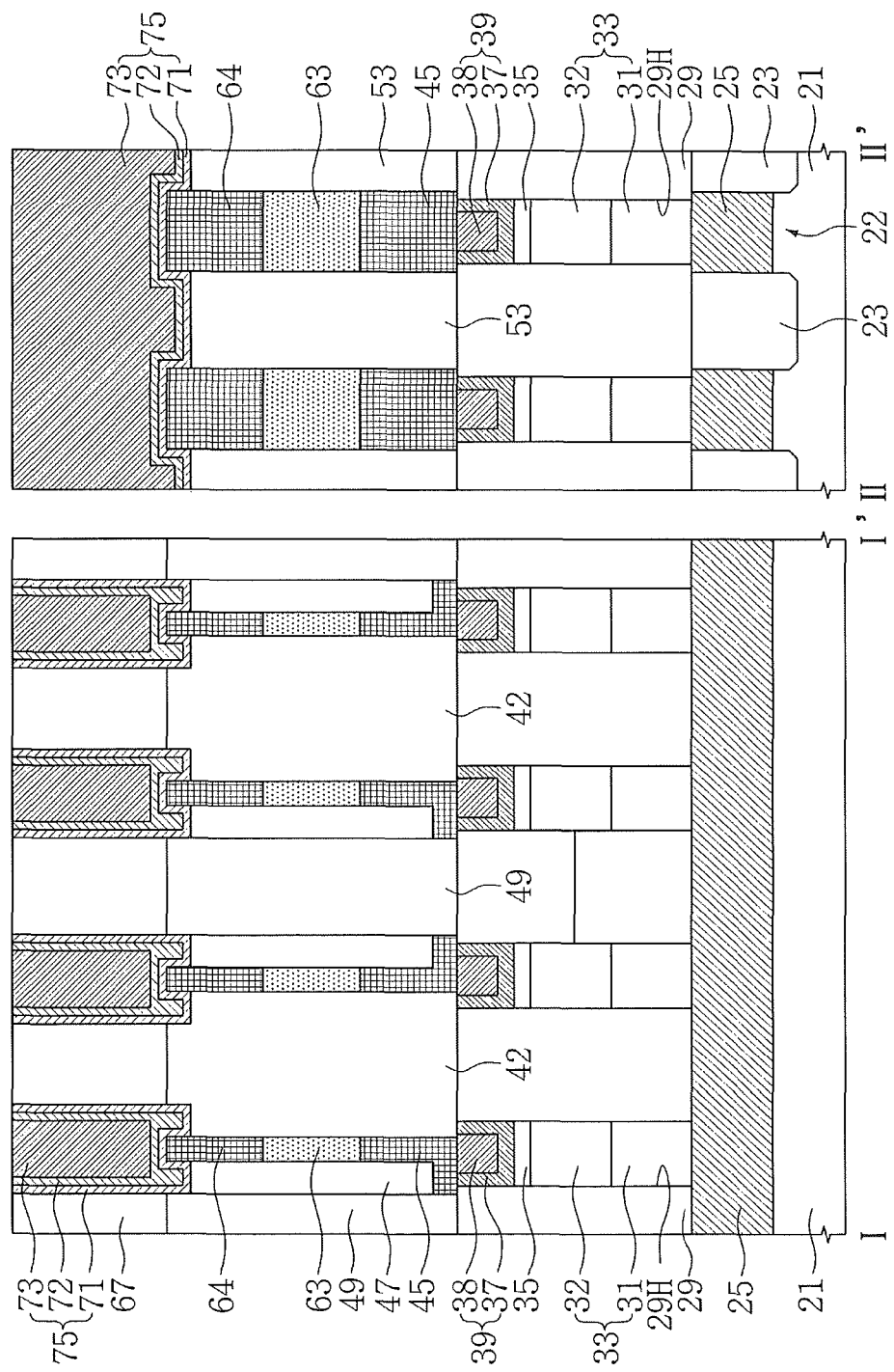

Referring to FIG. 9, each of the upper heaters 64 may be bar-shaped having a vertical length greater than a horizontal width thereof. A top surface of the upper heater 64 may be at substantially the same level as top surfaces of the first and second insulating patterns 42 and 49. Top end regions of the upper heaters 64 may be covered with the bit lines 75. Bottom ends of the bit lines 75 may extend at a lower level than top ends of the upper heaters 64. Top and lateral surfaces of the upper heater 64 may be in contact with the second barrier metal pattern 71.

Figure 10:
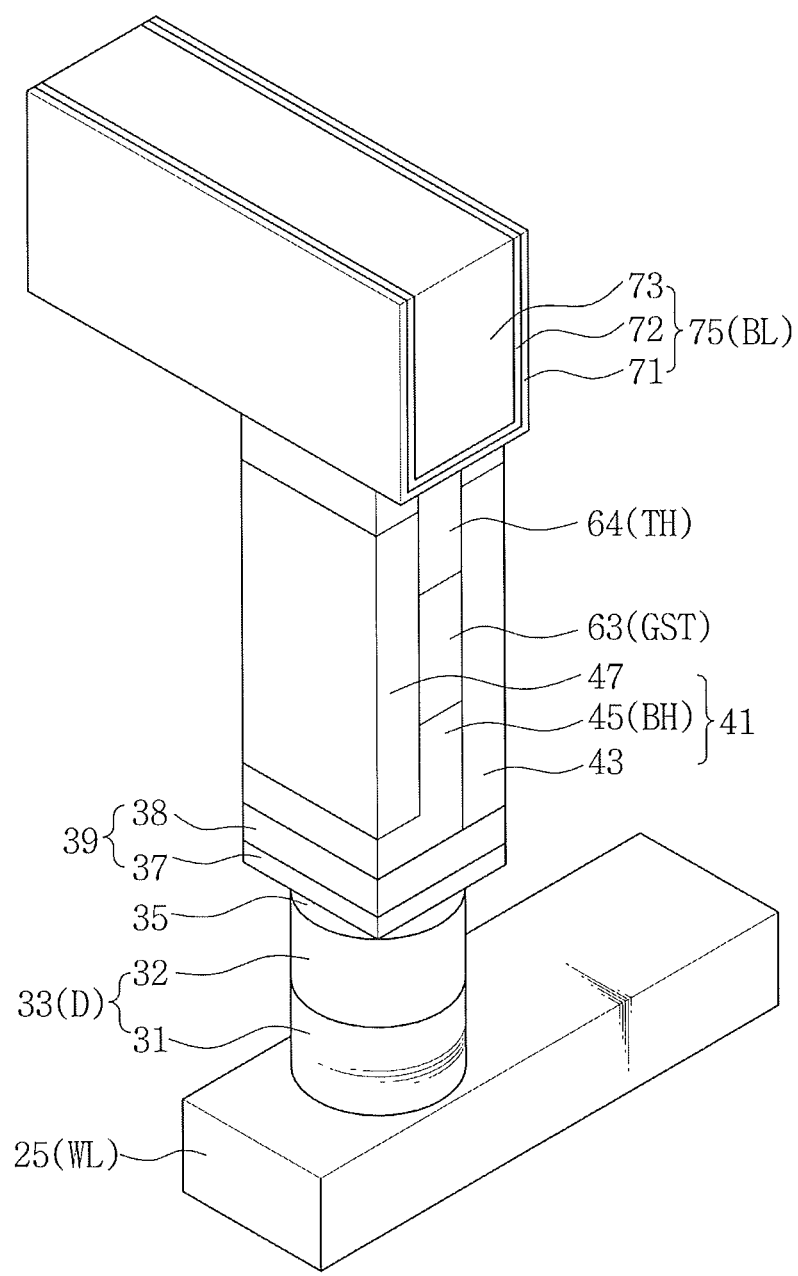
FIG. 10 is a perspective view of main components of a non-volatile memory device according to further embodiments of the inventive concept.
Figure 11:
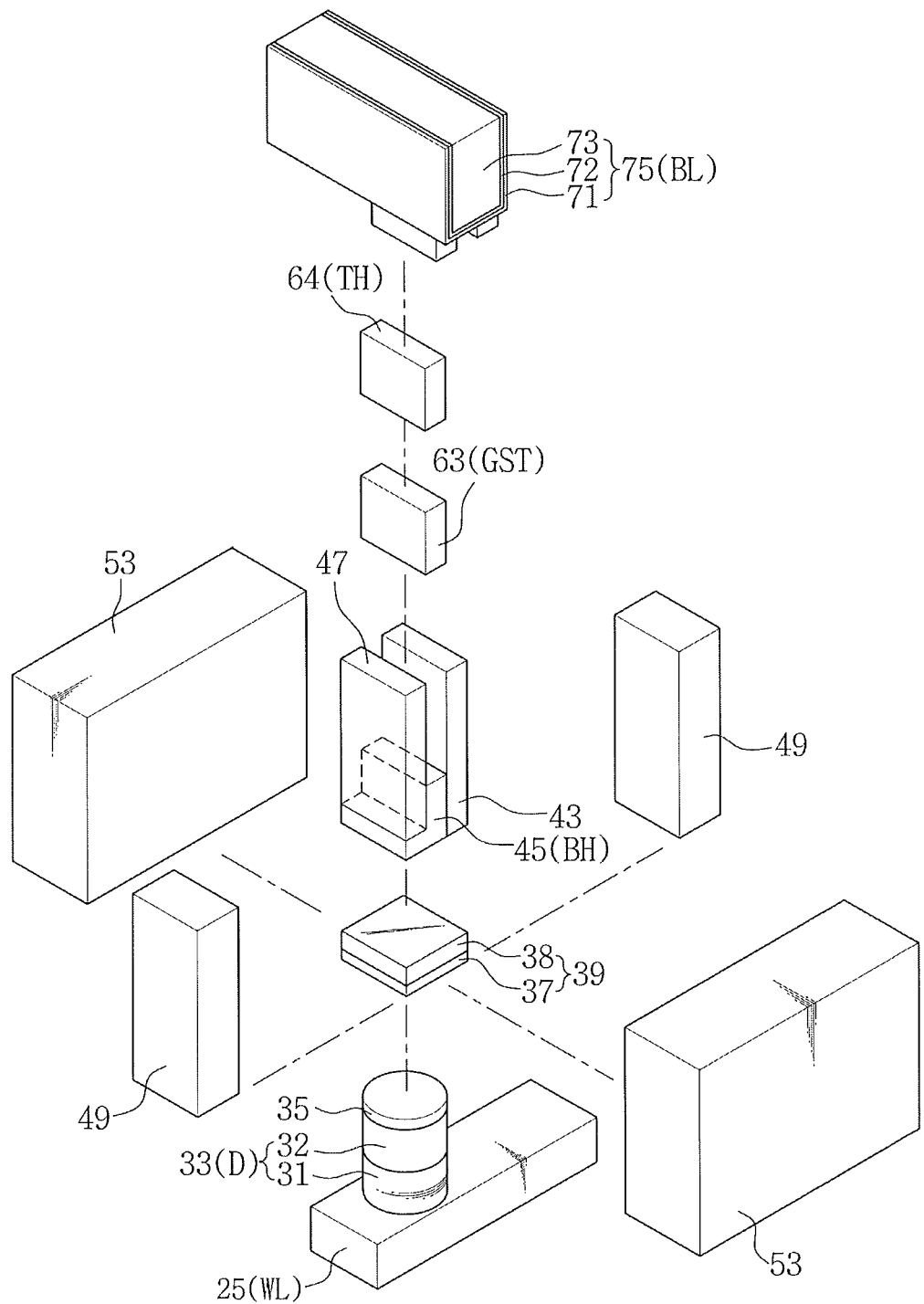
FIG. 11 is an exploded perspective view of FIG. 10.
Figure 12:
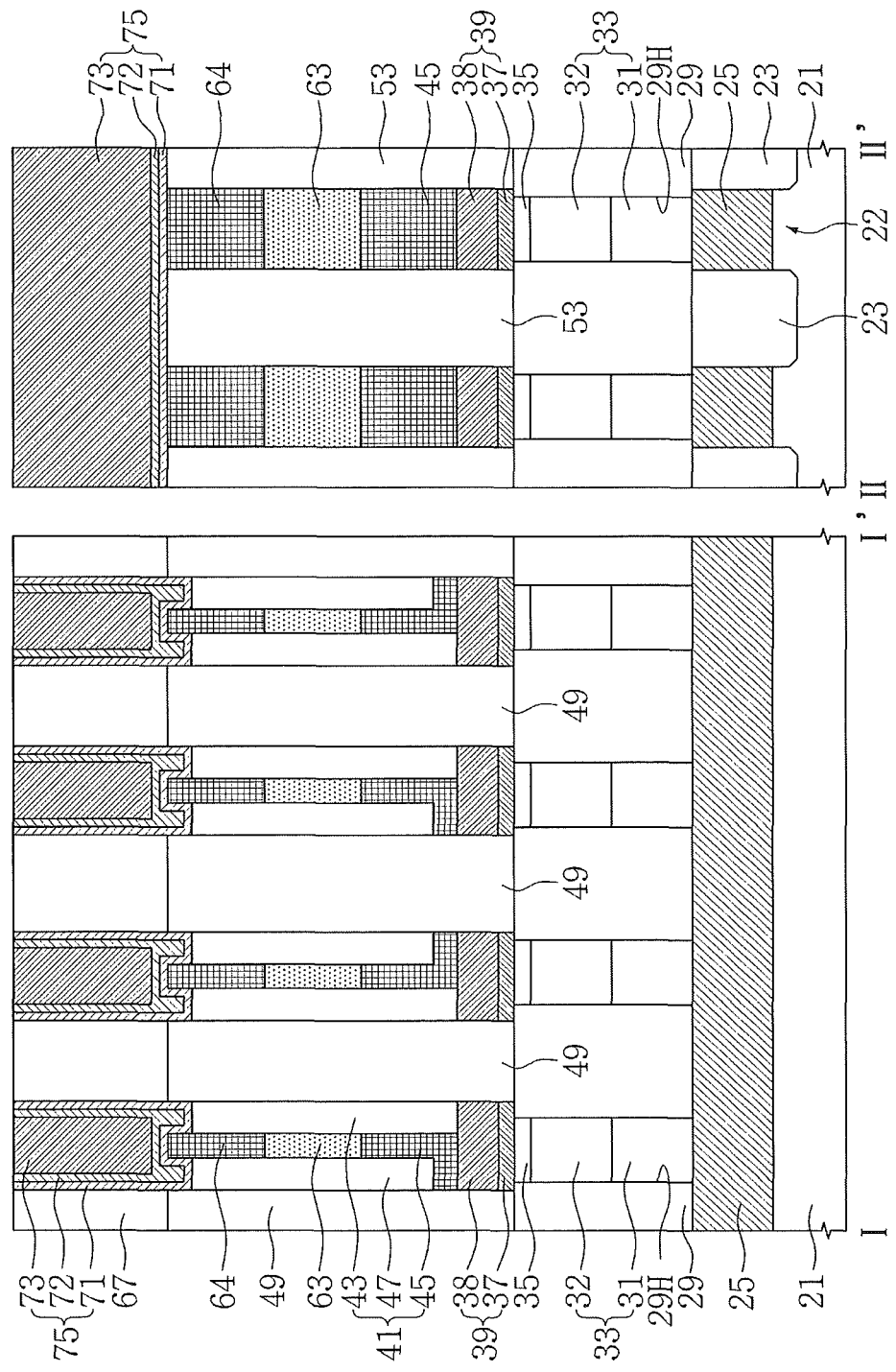
FIGS. 12 through 14 are cross-sectional views taken along lines I-I' and II-II' of FIG. 3, which illustrate the non-volatile memory device of FIG. 10.
Figure 13:
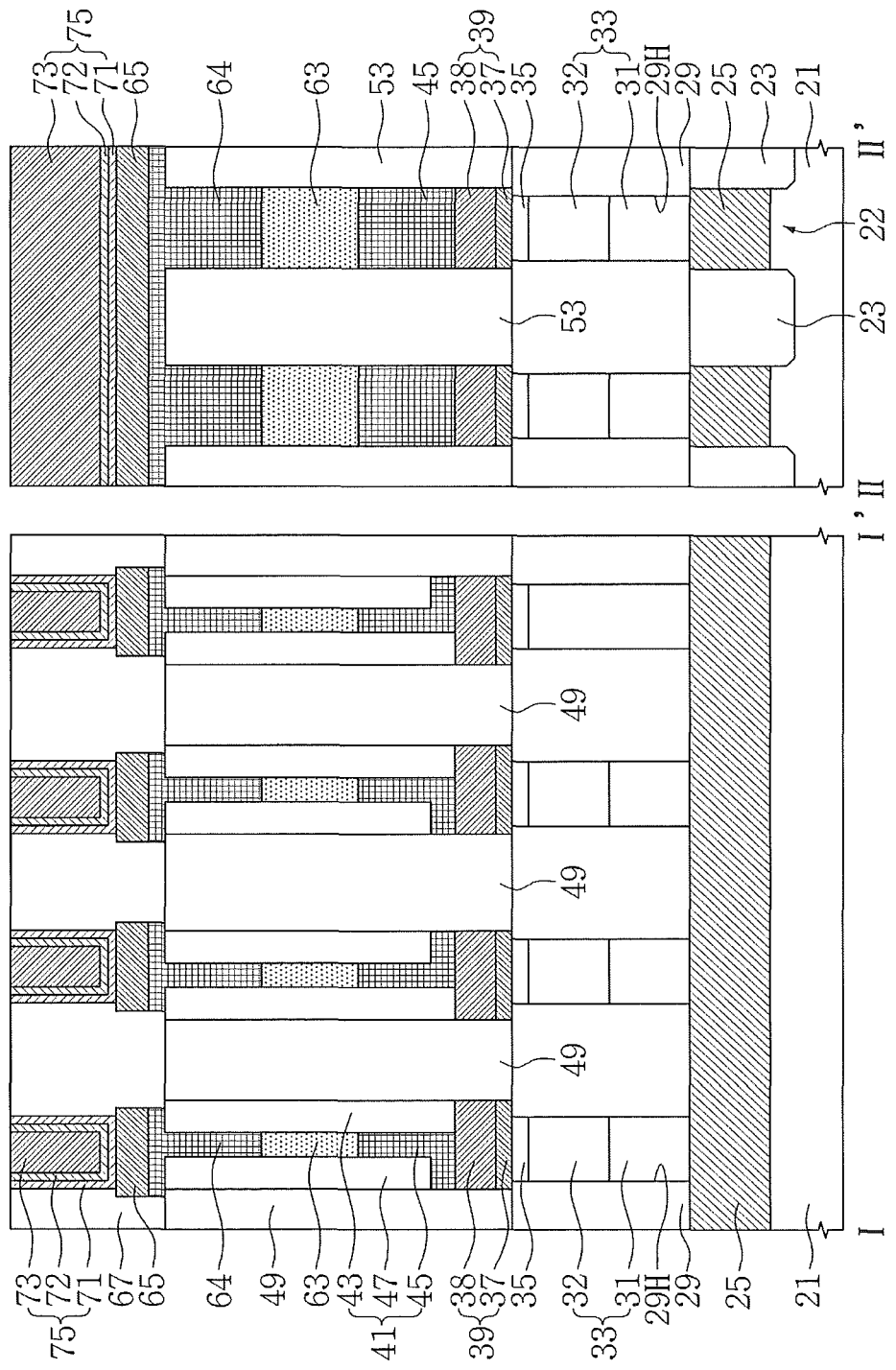
Figure 14:
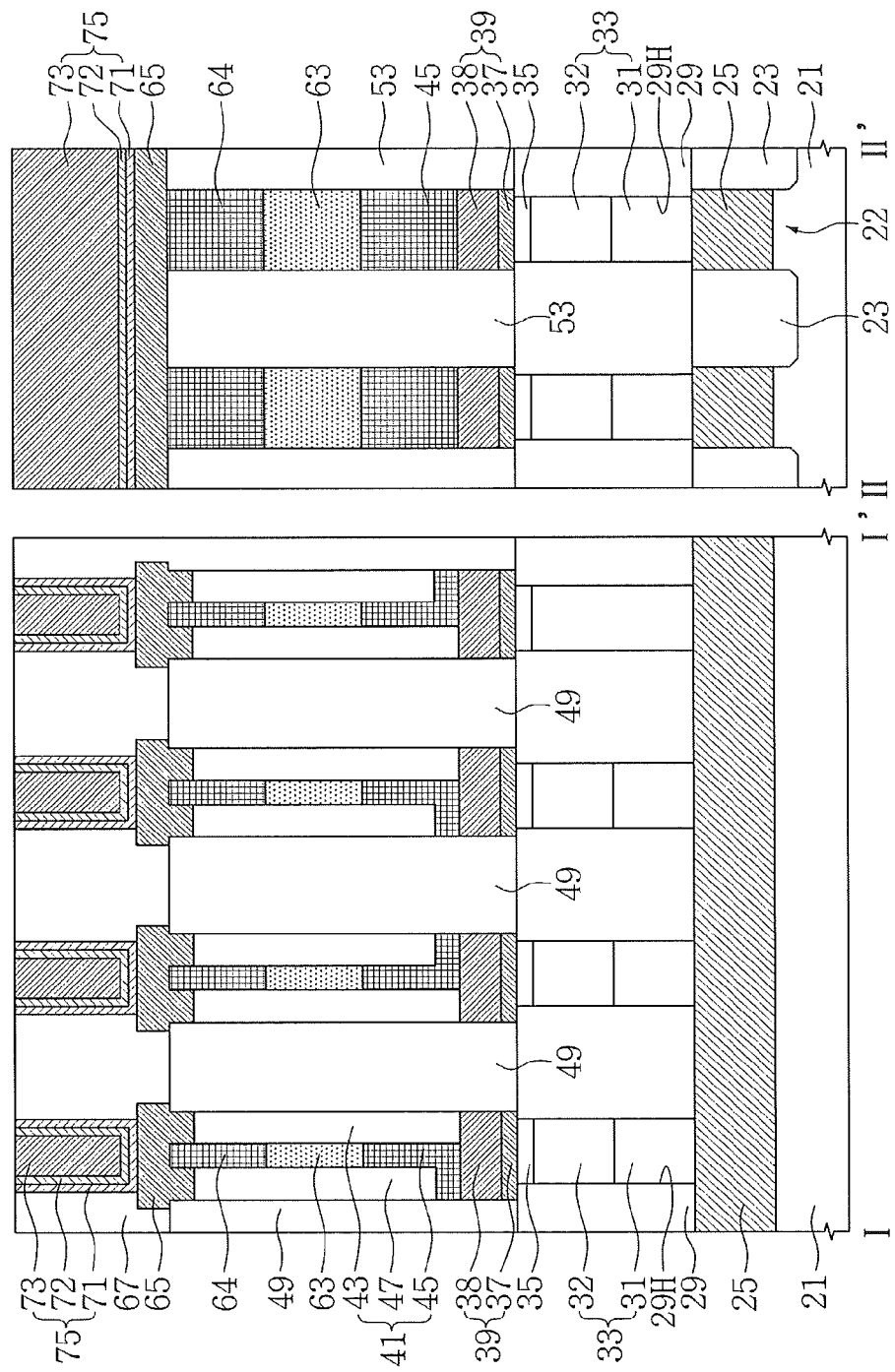

FIG. 10 is a perspective view of some components of a non-volatile memory device according to further embodiments of the inventive concept. FIG. 11 is an exploded perspective view for facilitating the understanding of FIG. 10. FIGS. 12 through 14 are cross-sectional views taken along lines I-I' and II-II' of FIG. 3, which illustrate the non-volatile memory device of FIG. 10.

Referring to FIGS. 10 and 11, a diode 33 may be formed on a word line 25. The diode 33 may include a first semiconductor pattern 31 and a second semiconductor pattern 32 stacked sequentially. A metal silicide pattern 35 may be formed on the diode 33. A lower pad 39 may be formed on the metal silicide pattern 35. The lower pad 39 may include a first barrier metal pattern 37 and a conductive pattern 38 stacked sequentially. An electrode structure 41 may be formed on the lower pad 39.

The electrode structure 41 may include a lower heater 45, a first spacer 43 formed on one lateral surface of the lower heater 45, and a second spacer 47 formed on a lateral surface facing the one lateral surface of the lower heater 45. A data storage pattern 63 may be formed on the lower heater 45. A bit line 75 may be formed on the upper heater 64 (that is, without an upper electrode therebetween). The bit line 75 may include a second barrier metal pattern 71, a seed layer 72, and a bit conductive layer 73.

A pair of insulating patterns 49 and a pair of insulating lines 53 may be formed to surround the lower pad 39, the electrode structure 41, the data storage pattern 63, and the upper heater 64. The pair of insulating lines 53 may be parallel to each other. The pair of insulating patterns 49 may be formed between the pair of insulating lines 53. The electrode structure 41, the data storage pattern 63, and the upper heater 64 may be formed between the pair of insulating patterns 49.

The metal silicide pattern 35 may be self-aligned on the diode 33. The metal silicide pattern 35 may have the same or similar shape as the diode 33. The lower pad 39 may have a different shape from the diode 33. For instance, the lower pad 39 may have a hexahedron shape, and the diode 33 may have a cylindrical shape. The lower pad 39 may have a greater planar area than the diode 33. The lower pad 39 may completely cover the metal silicide pattern 35. Lateral surfaces of the electrode structure 41 may be vertically aligned on lateral surfaces of the lower pad 39.

The data storage pattern 63 may be formed between the first and second spacers 43 and 47. The data storage pattern 63 may be self-aligned on the lower heater 45. The upper heater 64 may be formed between the first and second spacers 43 and 47. The upper heater 64 may be self-aligned on the data storage pattern 63. The bit line 75 may cover a top end and lateral surfaces of the upper heater 64. The top end and lateral surfaces of the upper heater 64 may be in contact with the second barrier metal pattern 71.

Referring to FIGS. 3 and 12, an element isolation layer 23 may be formed on predetermined regions of a substrate 21 to define active regions 22. Word lines 25 may be formed within the active regions 22. A molding layer 29 may be formed on the word lines 25 and the element isolation layer 23. Contact holes 29H may be formed through the molding layer 29. A first semiconductor pattern 31, a second semiconductor pattern 32, and a metal silicide pattern 35 may be sequentially stacked within each of the contact holes 29H. The first and second semiconductor patterns 31 and 32 may constitute or define the diode 33. Top surfaces of the metal silicide patterns 35 and the molding layer 29 may be at substantially the same level. The diodes 33 and the metal silicide patterns 35 may completely fill the contact holes 29H.

The insulating lines 53, which are spaced apart from one another, may be formed on the molding layer 29. The insulating lines 53 may be bar-shaped and may extend parallel to each other. The insulating patterns 49 may be formed on the molding layer 29 and spaced apart from each other between the insulating lines 53. Lower pads 39 may be formed between the insulating patterns 49 and overlap the metal silicide patterns 35. Electrode structures 41 may be formed on the lower pads 39 between the insulating patterns 49. Each of the electrode structures 41 may include the lower heater 45, the first spacer 43 formed on one lateral surface of the lower heater 45, and the second spacer 47 formed on a lateral surface facing the one lateral surface of the lower heater 45.

The insulating patterns 49 may cross the insulating lines 53 at right angles. The lateral surfaces of the lower pads 39 and the electrode structures 41 may be in contact with the insulating patterns 49. The lateral surfaces of the electrode structures 41 may be vertically aligned on the lateral surfaces of the lower pads 39.

Data storage patterns 63 may be formed on the lower heaters 45. Each of the data storage patterns 63 may be formed between the first and second spacers 43 and 47. The data storage patterns 63 may be self-aligned on the lower heaters 45. Upper heaters 64 may be formed on the data storage pattern 63. Each of the upper heaters 64 may be formed between the first and second spacers 43 and 47. The upper heaters 64 may be self-aligned on the data storage patterns 63.

An upper insulating layer 67 may be formed on the insulating lines 53, the insulating patterns 49, the first spacers 43, the second spacer 47, and the upper heaters 64. Bit lines 75 may be formed through the upper insulating layer 67 and in contact with the upper heaters 64. Each of the bit lines 75 may include the second barrier metal pattern 71, the seed layer 72, and the bit conductive layer 73 stacked sequentially. The bit lines 75 may cover top ends and lateral or sidewall surfaces of the upper heaters 64. The top end and lateral surface of each of the upper heaters 64 may be in contact with the second barrier metal pattern 71.

Referring to FIG. 13, a top end region of each of the upper heaters 64 may extend on the first spacer 43, the second spacer 47, the insulating pattern 49, and the insulating lines 53. Upper electrodes 65 may be formed on the upper heaters 64. The upper insulating layer 67 may be formed on the insulating lines 53, the insulating patterns 49, and the upper electrodes 65. The bit lines 75 may be formed through the upper insulating layer 67 and in contact with the upper electrodes 65.

Referring to FIG. 14, upper heaters 64 may be formed on the data storage patterns 63. Upper electrodes 65 may be formed to cover the top ends and lateral or sidewall surfaces of the upper heaters 64. An upper insulating layer 67 may be formed on the insulating lines 53, the insulating patterns 49, and the upper electrodes 65. The bit lines 75 may be formed through the upper insulating layer 67 and in contact with the upper electrodes 65.

FIGS. 15 through 29 are cross-sectional views taken along lines I-I' and II-II' of FIG. 3, which illustrate methods of fabricating a non-volatile memory device according to still further embodiments of the inventive concept. The layout of FIG. 3 and the cross-sectional views of FIGS. 15 through 29 may correspond to a cell region of a phase-change memory device.

Figure 15:
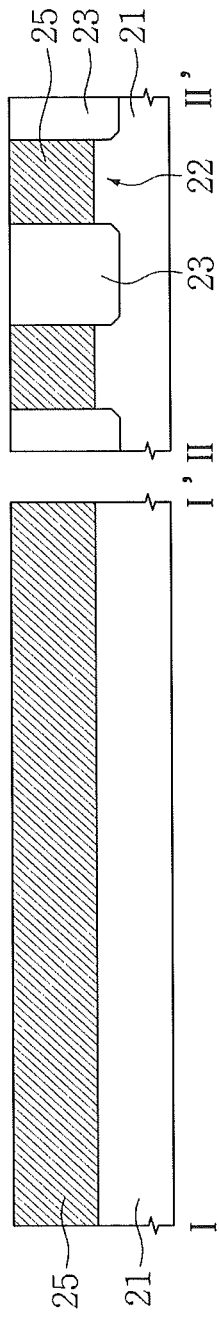
FIGS. 15 through 29 are cross-sectional views taken along lines I-I' and II-II' of FIG. 3, which illustrate a method of fabricating a non-volatile memory device according to still further embodiments of the inventive concept.

Referring to FIGS. 3 and 15, an element isolation layer 23 may be formed on predetermined regions of a substrate 21 to define active regions 22. Word lines 25 may be formed within the active regions 22. The word lines 25 may be parallel to each other. The element isolation layer 23 may be formed between the word lines 25.

The substrate 21 may be a semiconductor substrate, such as a single-crystalline silicon wafer or a silicon-on-insulator (SOI) wafer. Hereinafter, it will be assumed that the substrate 21 is a silicon wafer containing p-type impurity ions. The element isolation layer 23 may be formed using a shallow trench isolation (STI) technique. The element isolation layer 23 may include silicon oxide, silicon nitride, silicon oxynitride, or a combination thereof. The word lines 25 may be formed by implanting n-type impurity ions into the active regions 22.

In other embodiments, the word lines 25 may be conductive lines formed on the substrate 21. However, further description of the conductive lines will be omitted for brevity.

Figure 16:
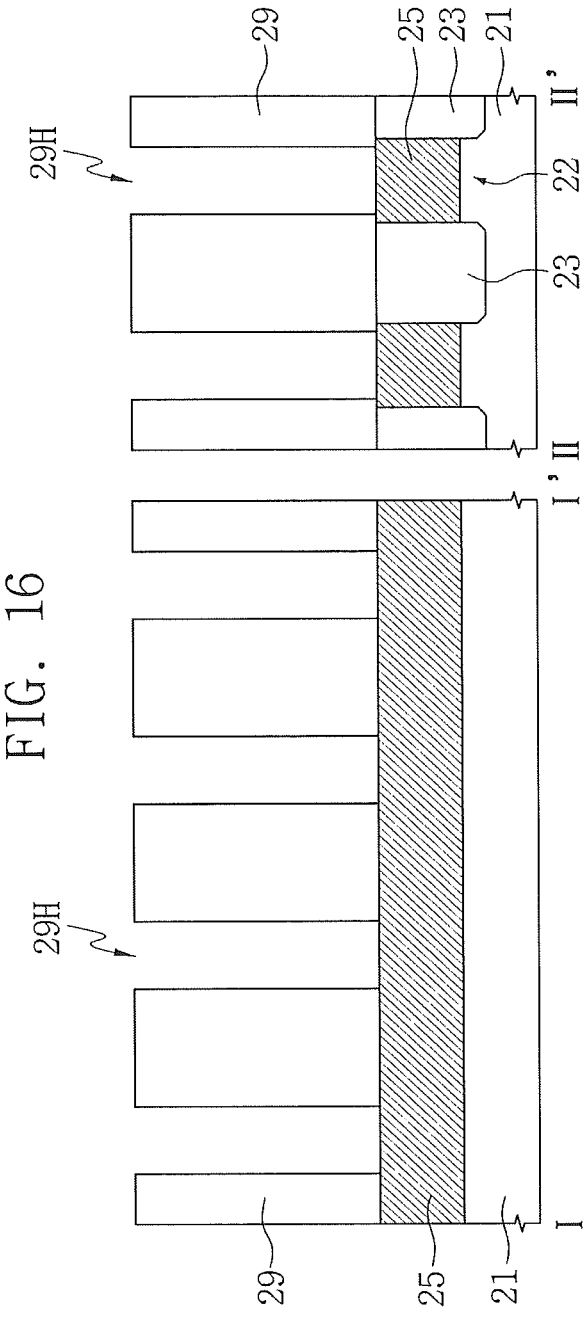

Referring to FIGS. 3 and 16, a molding layer 29 may be formed on the substrate 21 having the word lines 25. Contact holes 29H may be formed through the molding layer 29 to expose the word lines 25. The contact holes 29H may be aligned at regular intervals along the word lines 25. The contact holes 29H may be spaced apart from one another. Each of the contact holes 29H may have an aspect ratio of about 10:1 or higher.

The molding layer 29 may include silicon oxide, silicon nitride, silicon oxynitride, or a combination thereof. For example, the molding layer 29 may include silicon oxide. The molding layer 29 may cover the word lines 25 and the element isolation layer 23. Although an additional etch stop layer may be formed between the word lines 25 and the molding layer 29, a description of the etch stop layer will be omitted for brevity. The contact holes 29H may be formed using a patterning technique. For example, the contact holes 29H may be formed using photolithography and anisotropic etching processes. Each of the contact holes 29H may have one of various shapes, such as a circular shape, a tetragonal shape, or a tetragonal shape with round corners. Each of the contact holes 29H may have a smaller width than each of the word lines 25.

Figure 17:
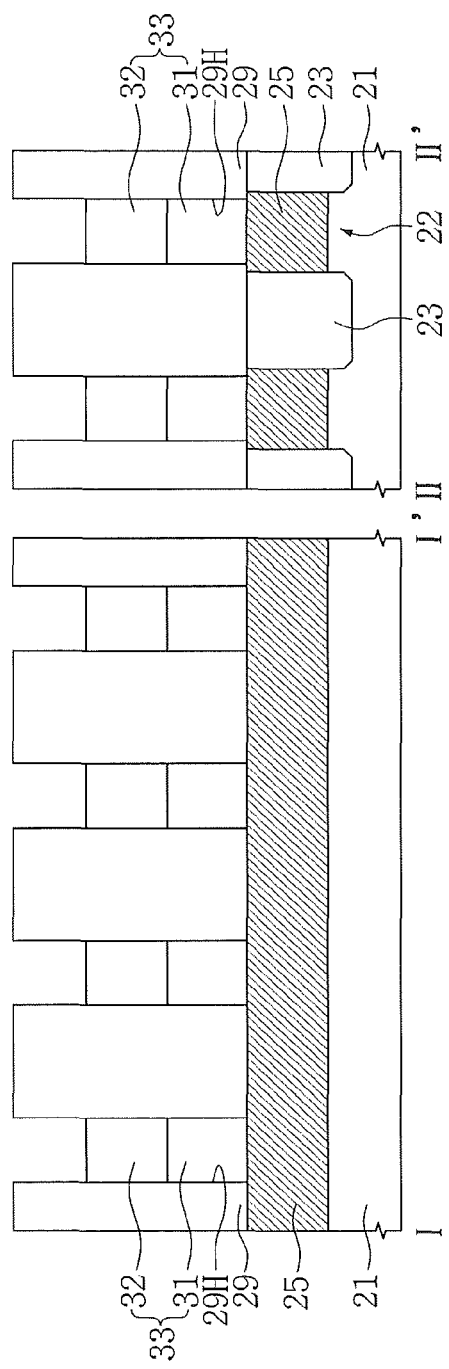

Referring to FIGS. 3 and 17, a first semiconductor pattern 31 and a second semiconductor pattern 32 may be sequentially formed within each of the contact holes 29H. The first and second semiconductor patterns 31 and 32 may constitute or define a diode 33. The diode 33 may function as a switching element.

The first and second semiconductor patterns 31 and 32 may be formed using a selective epitaxial growth (SEG) technique. The first semiconductor pattern 31 may be formed between the second semiconductor pattern 32 and the word lines 25. The first semiconductor pattern 31 may include a silicon layer containing n-type impurity ions. The second semiconductor pattern 32 may include a silicon layer containing p-type impurity ions.

In other embodiments, the first semiconductor pattern 31 may be omitted. In other embodiments, the first and second semiconductor patterns 31 and 32 may be stacked in the reverse order.

Figure 18:
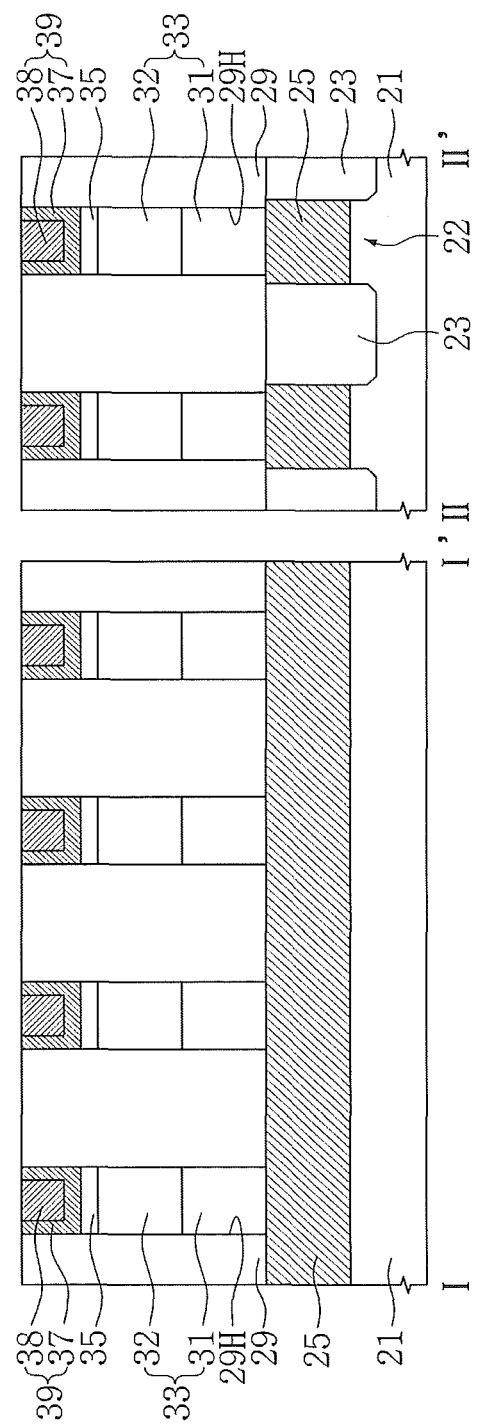

Referring to FIGS. 3 and 18, a metal silicide pattern 35 may be formed on the diode 33. A first barrier metal pattern 37 and a conductive pattern 38 may be sequentially formed on the metal silicide pattern 35. The first barrier metal pattern 37 and the conductive pattern 38 may collectively constitute or define a lower pad 39.

The metal silicide pattern 35 may be in contact with the second semiconductor pattern 32. The first barrier metal pattern 37 and the conductive pattern 38 may be formed using a thin-layer forming process and a planarization process. A top surface of the lower pad 38 may be at the same level as (e.g., coplanar with) a top surface of the molding layer 29. The first barrier metal pattern 37 may surround lateral and bottom surfaces of the conductive pattern 38. The first barrier metal pattern 37 may be in contact with the metal silicide pattern 35.

The metal silicide pattern 35 may include cobalt silicide (CoSi), nickel silicide (NiSi), tungsten silicide (WSi), titanium silicide (TiSi), or tantalum silicide (TaSi). For example, the metal silicide pattern 35 may be formed using a CoSi layer. The first barrier metal pattern 37 may include Ti, TiN, titanium aluminum nitride (TiAlN), titanium carbon nitride (TiCN), TiSiN, titanium oxynitride (TiON), tantalum (Ta), TaN, TaAlN, TaCN, TaSiN, C, CN, CoSi, CoSiN, WN, WSi, WSiN, or a combination thereof. The conductive pattern 38 may include Ti, TiN, TiAlN, TiCN, TiSiN, TiON, Ta, TaN, TaAlN, TaCN, TaSiN, C, CN, CoSi, CoSiN, W, WN, WSi, WSiN, Ni, or a combination thereof. For example, the first barrier metal pattern 37 may include a Ti/TiN layer, while the conductive pattern 38 may include a tungsten (W) layer.

Figure 19:
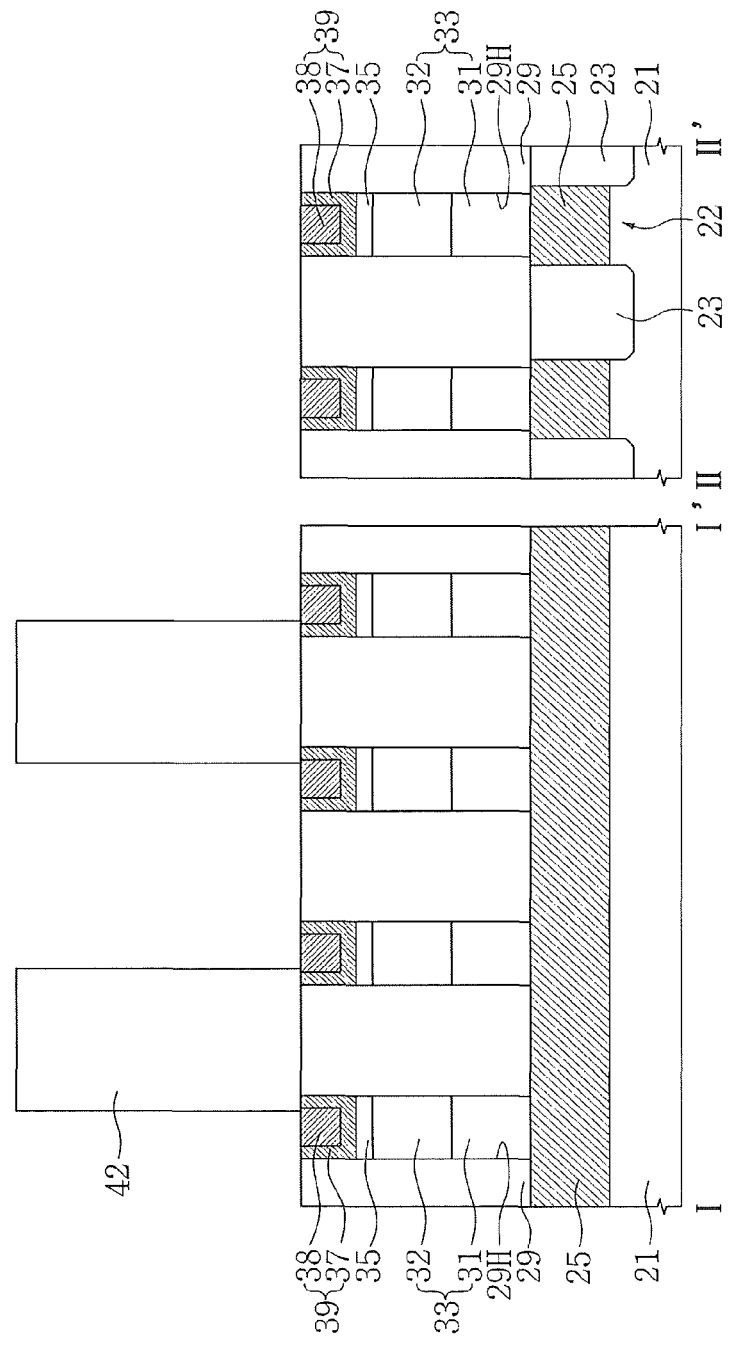

Referring to FIGS. 3 and 19, first insulating patterns 42 may be formed on the molding layer 29. The first insulating patterns 42 may partially cover the lower pads 39. The first insulating patterns 42 may be formed using a thin-layer forming process and a patterning process. The first insulating patterns 42 may include silicon oxide, silicon nitride, silicon oxynitride, or a combination thereof.

Figure 20:
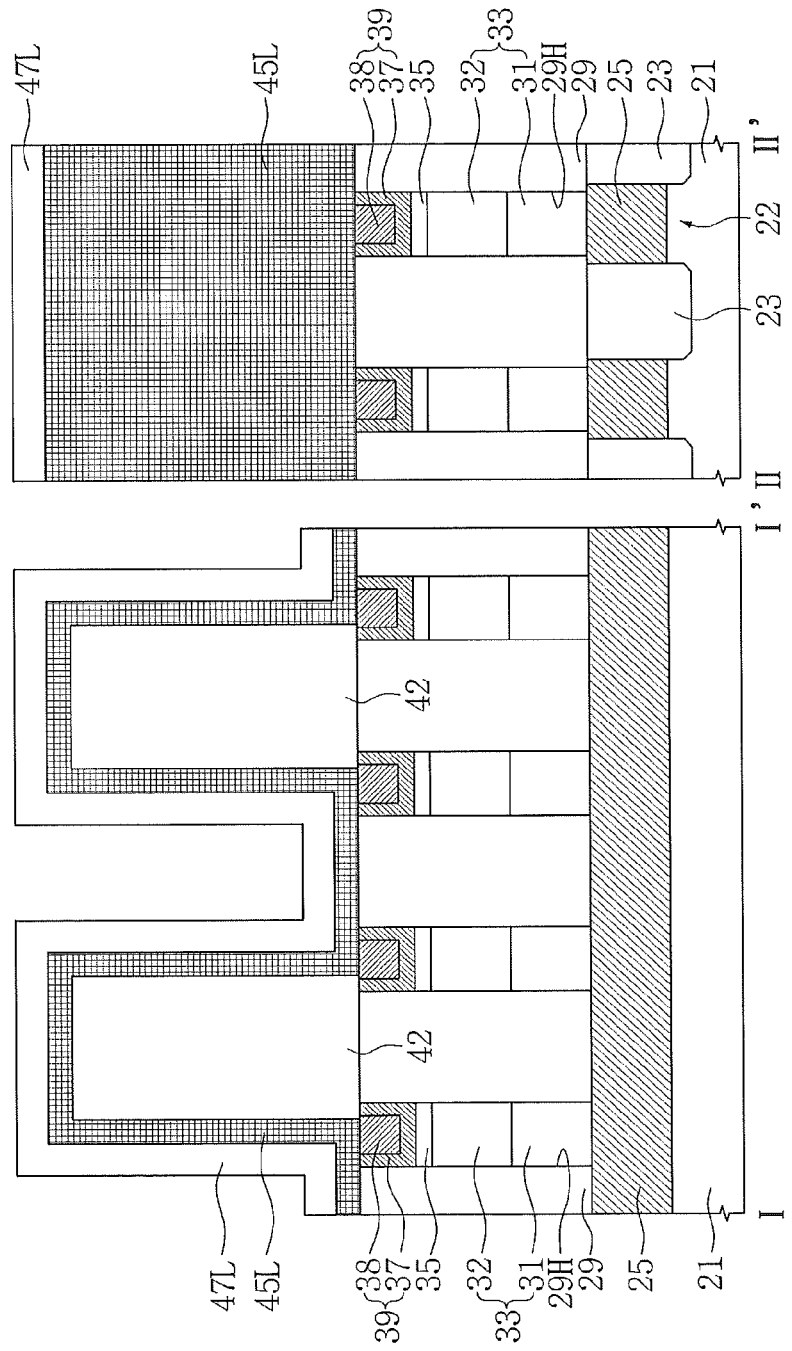

Referring to FIGS. 3 and 20, a lower heater layer 45L and a spacer layer 47L may be sequentially formed on the entire surface of the substrate 21. The lower heater 45L may cover top and lateral surfaces of the first insulating patterns 42, and cover the lower pads 39. The spacer layer 47L may cover the lower heater layer 45L. The lower heater layer 45L may include Ti, TiN, TiAlN, TiCN, TiSiN, TiON, Ta, TaN, TaAlN, TaCN, TaSiN, C, CN, CoSi, CoSiN, W, WN, WSi, WSiN, Ni, or a combination thereof. For instance, the lower heater layer 45L may include TiSiN. The spacer layer 47L may include silicon oxide, silicon nitride, silicon oxynitride, or a combination thereof.

Figure 21:
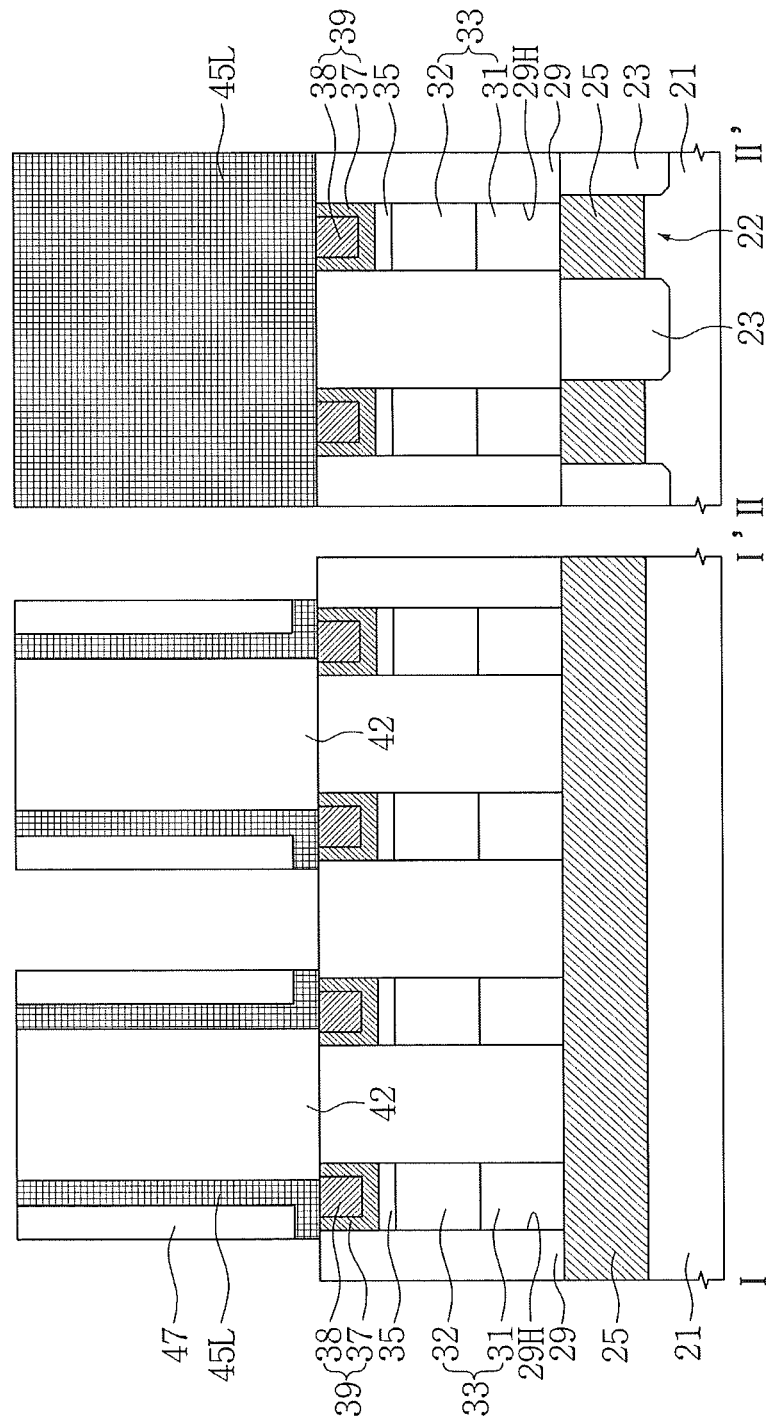

Referring to FIGS. 3 and 21, the spacer layer 47L may be anisotropically etched until the lower heater layer 45L is exposed, thereby forming spacers 47. The exposed lower heater layer 45L may be removed to expose the molding layer 29 and the first insulating patterns 42. The removal of the exposed lower heater layer 45L may be performed using an anisotropic etching process and/or an isotropic etching process. As a result, the lower heater layer 45L may be retained between the spacers 47 and the first insulating patterns 42, between the spacers 47 and the lower pads 39, and between the spacers 47 and the molding layer 29.

Figure 22:
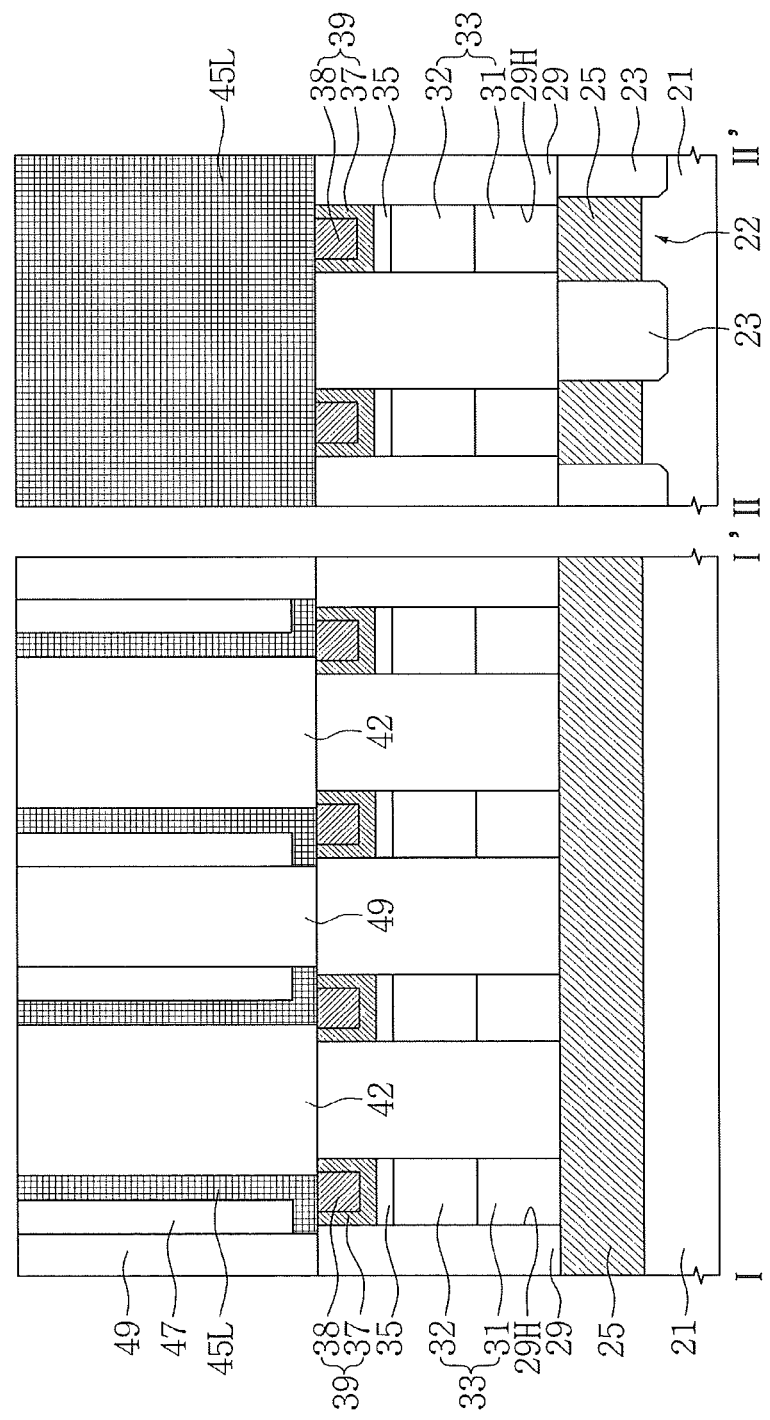

Referring to FIGS. 3 and 22, second insulating patterns 49 may be formed on the exposed molding layer 29. The second insulating patterns 49 may be formed using a thin-layer forming process and a planarization process. The second insulating patterns 49 may include silicon oxide, silicon nitride, silicon oxynitride, or a combination thereof. Top surfaces of the second insulating patterns 49, the spacers 47, the lower heater layer 45L, and the first insulating patterns 42 may be exposed on the same plane surface. In other words, upper surfaces of the second insulating patterns 49, the spacers 47, the lower heater 45, and the first insulating patterns 42 may be coplanar.

Figure 23:
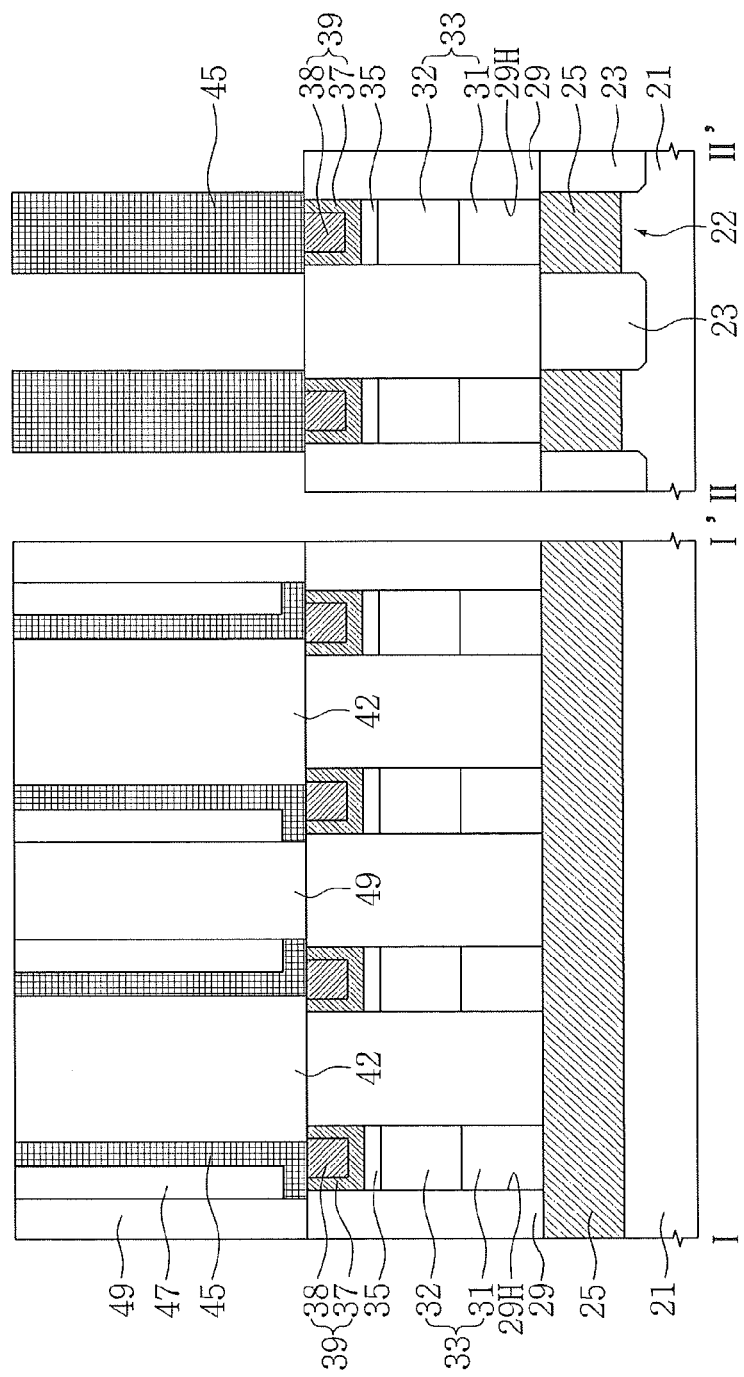

Referring to FIGS. 3 and 23, the lower heater layer 45L may be patterned to form lower heaters 45. The molding layer 29 may be exposed between the lower heaters 45. During the patterning of the lower heater layer 45L, the second insulating patterns 49, the spacers 47, and the first insulating patterns 42 may also be patterned at once. A horizontal width of the lower heaters 45 may be determined by a deposited thickness of the lower heater layer 45L. For example, the lower heaters 45 may be formed to a narrow horizontal width of about 10 nm or less.

Figure 24:
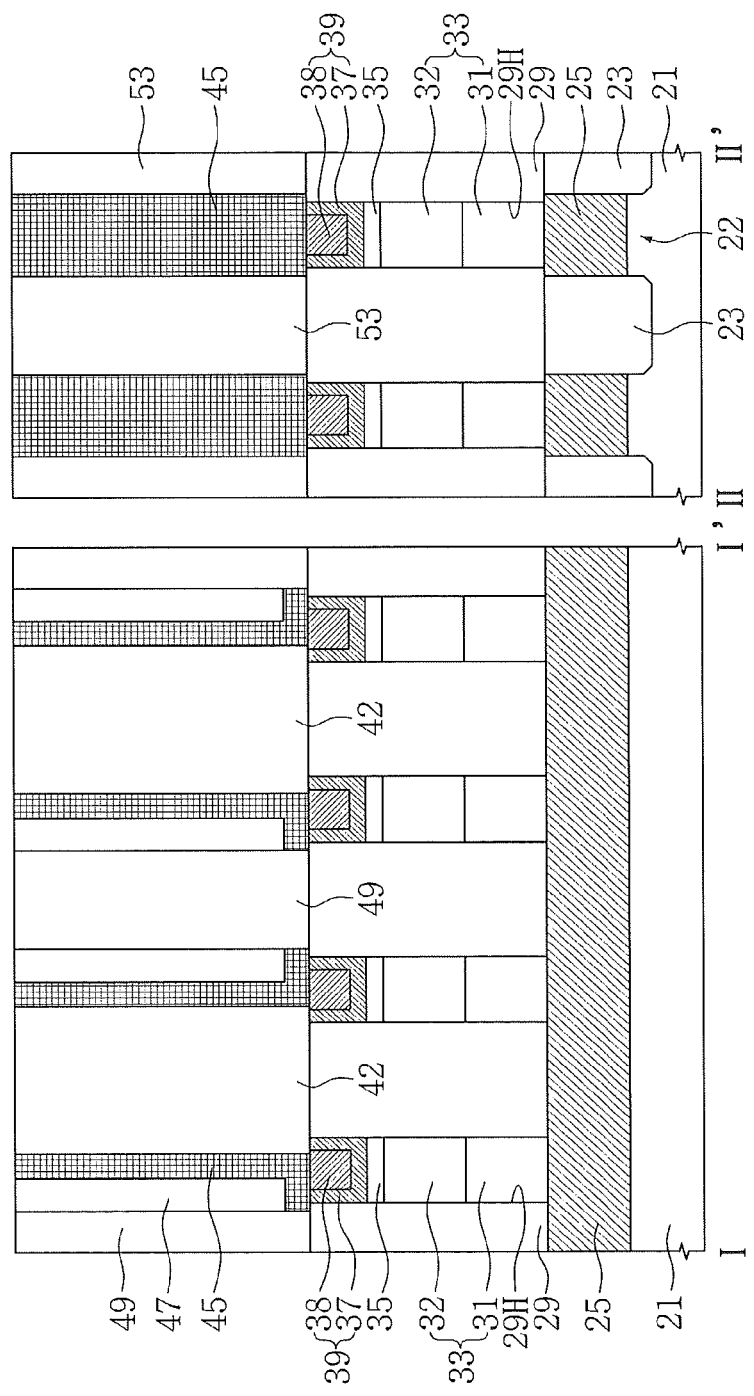

Referring to FIGS. 3 and 24, insulating lines 53 may be formed on the exposed molding layer 29. The insulating lines 53 may be formed using a thin-layer forming process and a planarization process. The insulating lines 53 may include silicon oxide, silicon nitride, silicon oxynitride, or a combination thereof. Top surfaces of the insulating lines 53, the second insulating patterns 49, the spacers 47, the lower heaters 45, and the first insulating patterns 42 may be exposed on the same plane surface. In other words, upper surfaces of the insulating lines 53, the second insulating patterns 49, the spacers 47, the lower heaters 45, and the first insulating patterns 42 may be may be coplanar.

The insulating lines 53 may be parallel to each other. One selected from the second insulating patterns 49 and one of the first insulating patterns 42 corresponding to the selected second insulating pattern 49 may be formed opposite each other between the insulating lines 53. One of the lower heaters 45 and one of the spacers 47 may be formed between one selected from the second insulating patterns 49 and one of the first insulating patterns 42 corresponding to the selected second insulating pattern 49. Each of the lower heaters 45 may have a dash or rectangular shape from a plan view. Each of the lower heaters 45 may have an "L" shape from a cross-sectional view.

Figure 25:
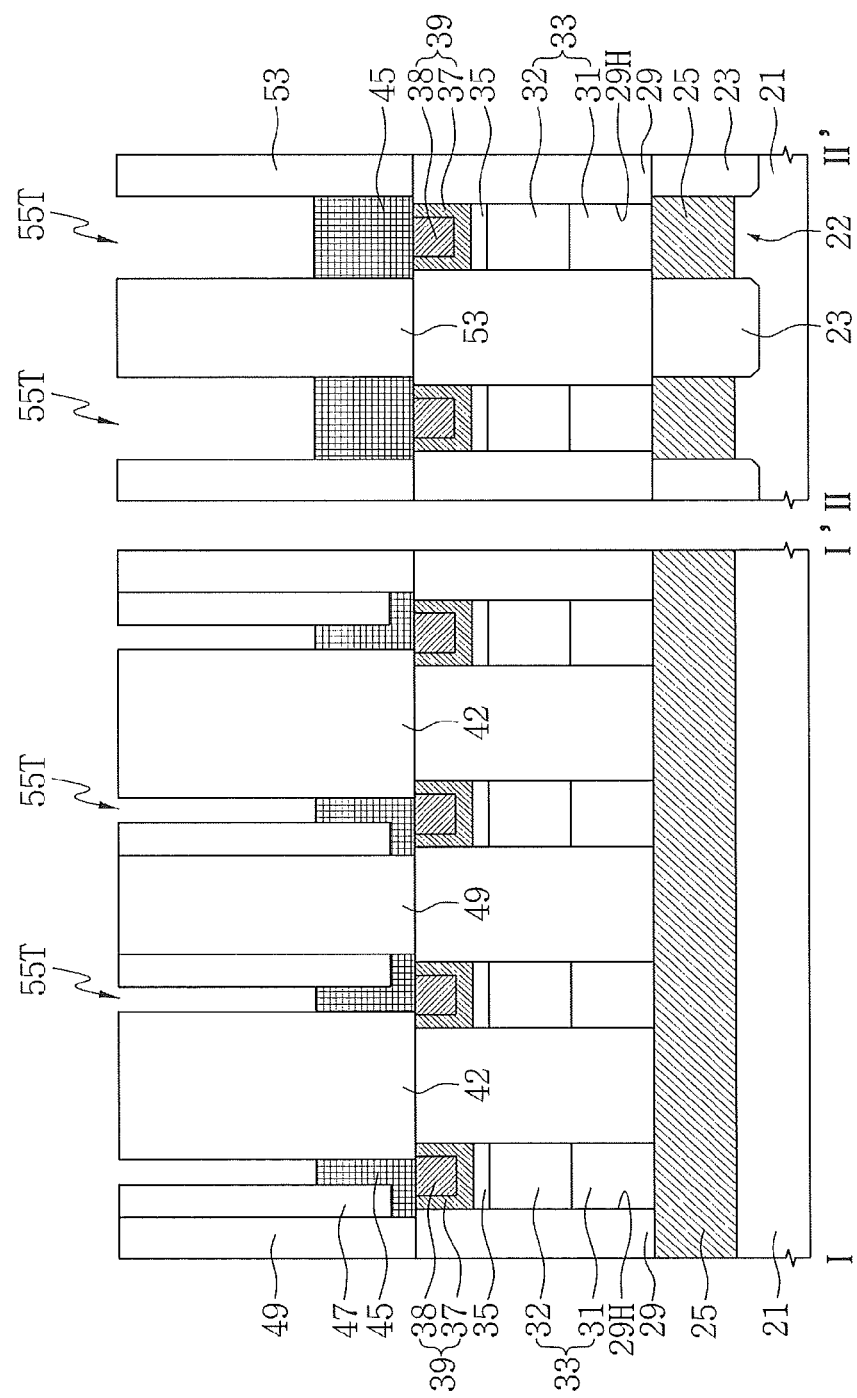

Referring to FIGS. 3 and 25, the lower heaters 45 may be partially recessed to form first trenches 55T. The recessing of the lower heaters 45 may be performed using a wet etchback process and/or a dry etchback process. The lower heaters 45 may be retained at a lower level than top ends of the insulating lines 53, the second insulating patterns 49, the spacers 47, and the first insulating patterns 42. The first trenches 55T may be defined among the insulating lines 53, the spacers 47, and the first insulating patterns 42. The insulating lines 53, the spacers 47, and the first insulating patterns 42 may be exposed on sidewalls of the first trenches 55T.

Figure 26:
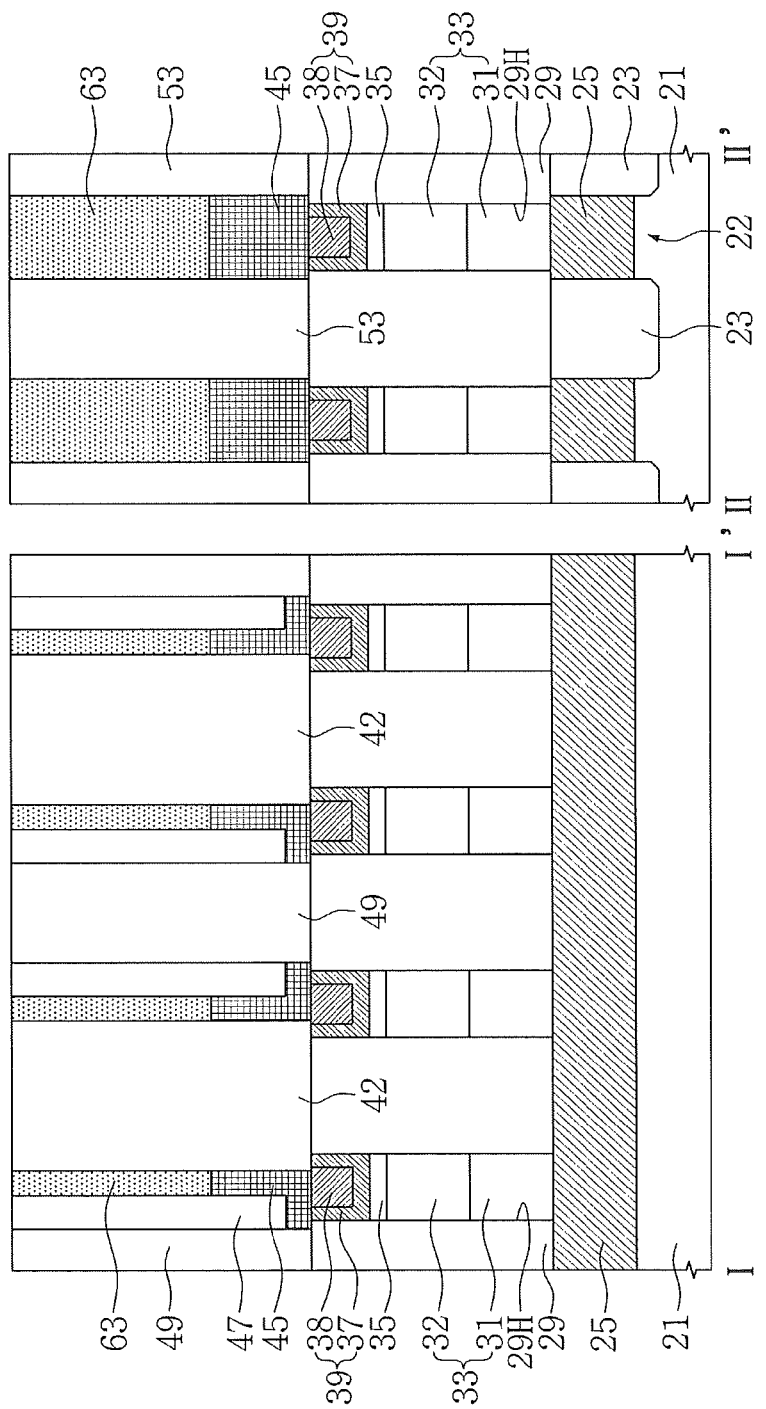

Referring to FIGS. 3 and 26, data storage patterns 63 may be formed to fill the first trenches 55T. The data storage patterns 63 may be formed using a thin-layer forming process and a planarization process. The data storage patterns 63 may be self-aligned on the lower heaters 45. Lateral surfaces of the data storage pattern 63 may be vertically aligned on lateral surfaces of the lower heater 45. In other words, sidewall surfaces of the data storage pattern 63 may be coplanar with sidewall surfaces of the lower heater 45.

The data storage patterns 63 may include phase-change plugs, polymer plugs, nanoparticles plugs, or resistance-variable plugs. For example, the resistance-variable plugs may include a strontium titanium oxide (SrTiO₃) layer. Also, when the data storage patterns 63 include phase-change plugs, the phase-change plugs may include germanium antimony telluride (GeSbTe), germanium tellurium arsenide (GeTeAs), tin tellurium tin (SnTeSn), GeTe, SbTe, SeTeSn, germanium tellurium selenide (GeTeSe), antimony selenium bismuth (SbSeBi), GeBiTe, GeTeTi, indium selenide (InSe), gallium tellurium selenide (GaTeSe), or InSbTe. Furthermore, the phase-change plugs may include a material layer obtained by adding one selected from the group consisting of C, Si, O, and N to one selected from the group consisting of a GeSbTe layer, a GeTeAs layer, a SnTeSn layer, a GeTe layer, a SbTe layer, a SeTeSn layer, a GeTeSe layer, a SbSeBi layer, a GeBiTe layer, a GeTeTi layer, an InSe layer, a GaTeSe layer, and an InSbTe layer.

Figure 27:
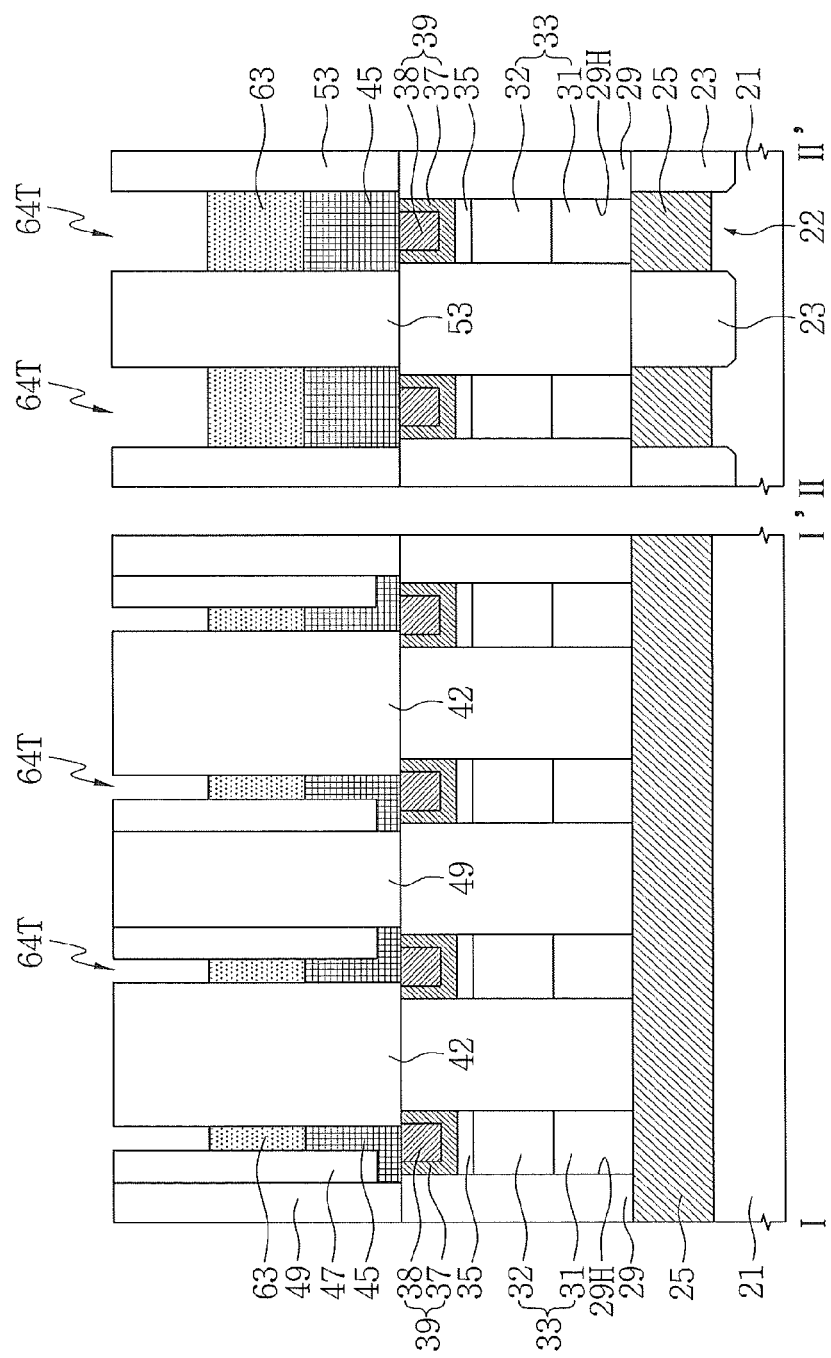

Referring to FIGS. 3 and 27, the data storage patterns 63 may be partially recessed to form second trenches 64T. The recessing of the data storage patterns 63 may be performed using a wet etchback process and/or a dry etchback process. For instance, the recessing of the data storage patterns 63 may include an etchback process using argon (Ar), hydrogen (H₂), helium (He), or a combination thereof.

The data storage patterns 63 may be retained at a lower level than the top ends of the insulating lines 53, the second insulating patterns 49, the spacers 47, and the first insulating patterns 42. The second trenches 64T may be defined among the insulating lines 53, the spacers 47, and the first insulating patterns 42. The insulating lines 53, the spacers 47, and the first insulating patterns 42 may be exposed on sidewalls of the second trenches 64T.

Figure 28:
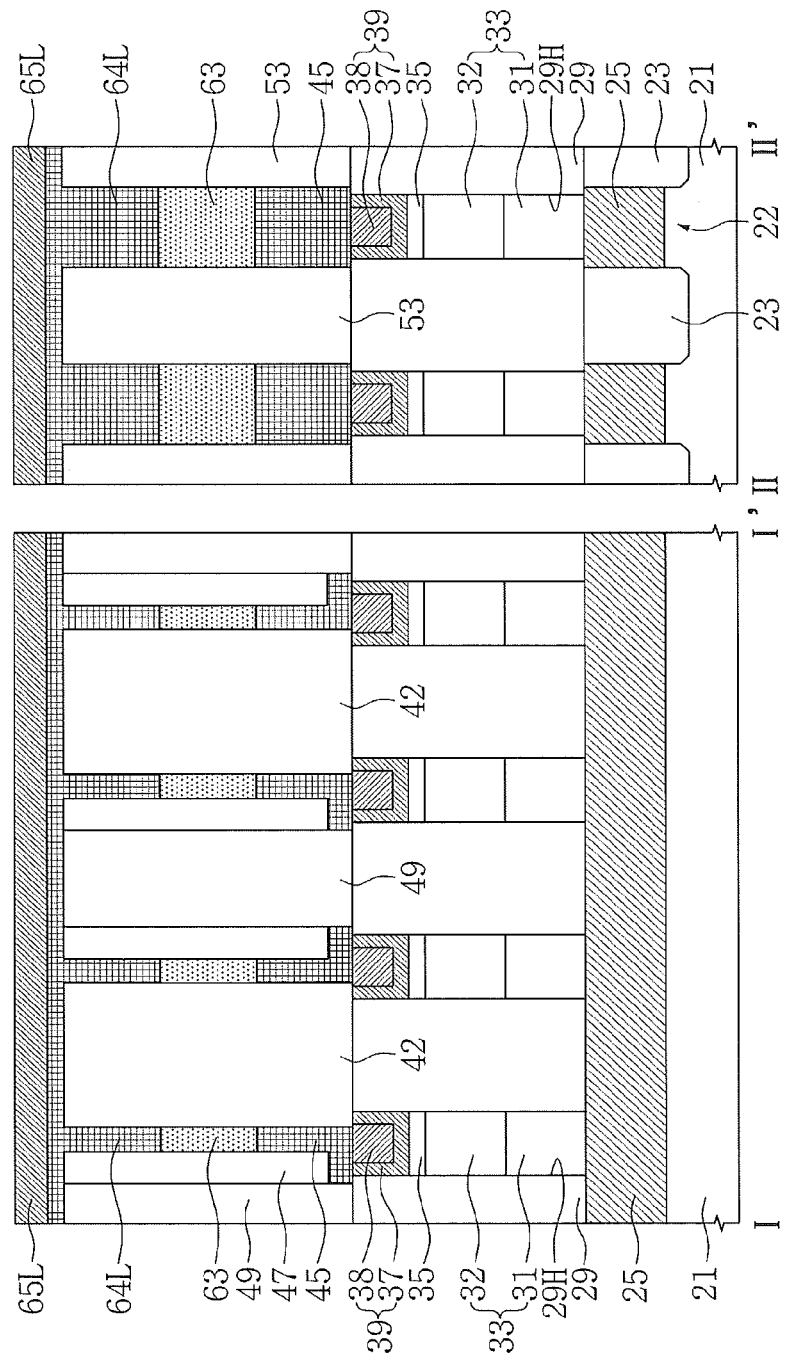

Referring to FIGS. 3 and 28, an upper heater layer 64L may be formed to fill the second trenches 64T, and cover the entire surface of the substrate 21. An upper electrode layer 65L may be formed on the upper heater layer 64L. The upper heater layer 64L may include Ti, TiN, TiAlN, TiCN, TiSiN, TiON, Ta, TaN, TaAlN, TaCN, TaSiN, C, CN, CoSi, CoSiN, W, WN, WSi, WSiN, Ni, or a combination thereof. The upper electrode layer 65L may include W, WN, WSi, WSiN, Ti, TiN, TiAlN, TiCN, TiSiN, TiON, Ta, TaN, TaAlN, TaCN, TaSiN, C, CN, CoSi, CoSiN, Ni, or a combination thereof. The upper heater layer 64L may be formed of a material having a greater electrical resistance than that of the upper electrode layer 65L. For example, the upper heater layer 64L may include TiSiN, and the upper electrode layer 65L may include TiN.

Figure 29:
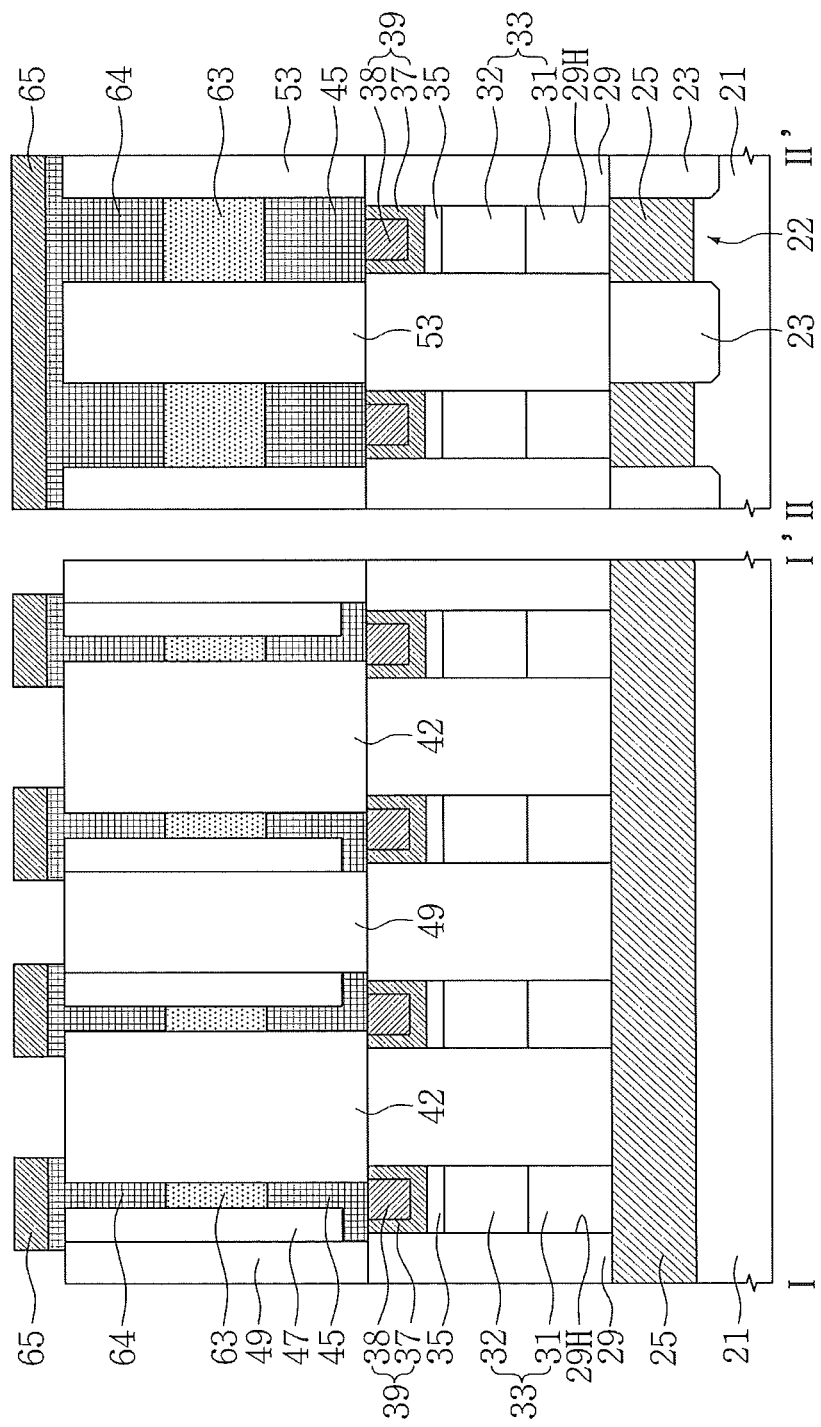

Referring to FIGS. 3 and 29, the upper heater layer 64L and the upper electrode layer 65L may be patterned, thereby forming upper heaters 64 and upper electrodes 65. The upper heaters 64 may be self-aligned on the data storage patterns 63. At least one lateral surface of the upper heater 64 may be vertically aligned on one lateral surface of the data storage pattern 63.

Referring back to FIGS. 3 and 4, an upper insulating layer 67 may be formed to cover the upper electrodes 65. Bit lines 75 may be formed through the upper insulating layer 67 and in contact with the upper electrodes 65. Each of the bit lines 75 may include a second barrier metal pattern 71, a seed layer 72, and a bit conductive layer 73 stacked sequentially.

The upper insulating layer 67 may include silicon oxide, silicon nitride, or silicon oxynitride. The second barrier metal pattern 71 may include Ti, TiN, or Ti/TiN. The seed layer 72 may include W, WN, WSi, WSiN, Ti, TiN, TiAlN, TiCN, TiSiN, TiON, Ta, TaN, TaAlN, TaCN, TaSiN, C, CN, CoSi, CoSiN, Ni, Al, Cu, or a combination thereof. The bit conductive layer 73 may include W, WN, WSi, WSiN, Ti, TiN, TiAlN, TiCN, TiSiN, TiON, Ta, TaN, TaAlN, TaCN, TaSiN, C, CN, CoSi, CoSiN, Ni, Al, Cu, or a combination thereof. The bit line conductive layer 73 may be formed of a material having a lower electrical resistance than the upper electrode 65. For example, the bit conductive layer 73 may include a Cu layer formed using an electroplating process.

FIGS. 30 through 37 are cross-sectional views taken along lines I-I' and II-IP of FIG. 3, which illustrate methods of fabricating a non-volatile memory device according to yet further embodiments of the inventive concept.

Figure 30:
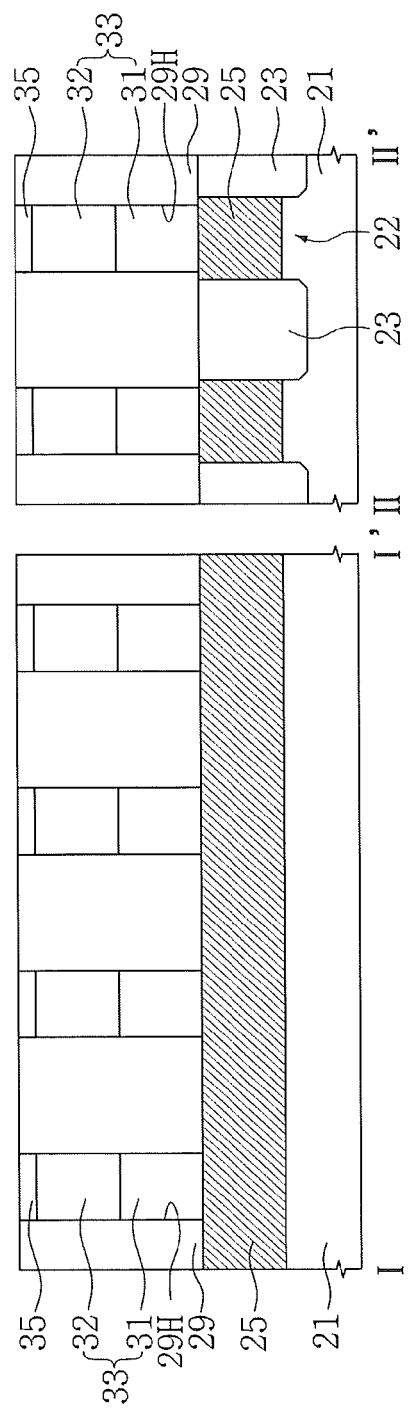
FIGS. 30 through 37 are cross-sectional views taken along lines I-I' and II-II' of FIG. 3, which illustrate a method of fabricating a non-volatile memory device according to yet further embodiments of the inventive concept.

Referring to FIGS. 3 and 30, an element isolation layer 23 may be formed on predetermined regions of a substrate 21 to define active regions 22. Word lines 25 may be formed within the active regions 22. A molding layer 29 may be formed on the substrate 21 having the word lines 25. Contact holes 29H may be formed through the molding layer 29 to expose the word lines 25. A first semiconductor pattern 31 and a second semiconductor pattern 32 may be sequentially formed within each of the contact holes 29H. The first and second semiconductor patterns 31 and 32 may constitute or define a diode 33. A metal silicide pattern 35 may be formed on the diode 33. The metal silicide pattern 35 may be in contact with the second semiconductor pattern 32. A top surface of the metal silicide pattern 35 may be at the same level as (e.g., coplanar with) a top surface of the molding layer 29.

Figure 31:
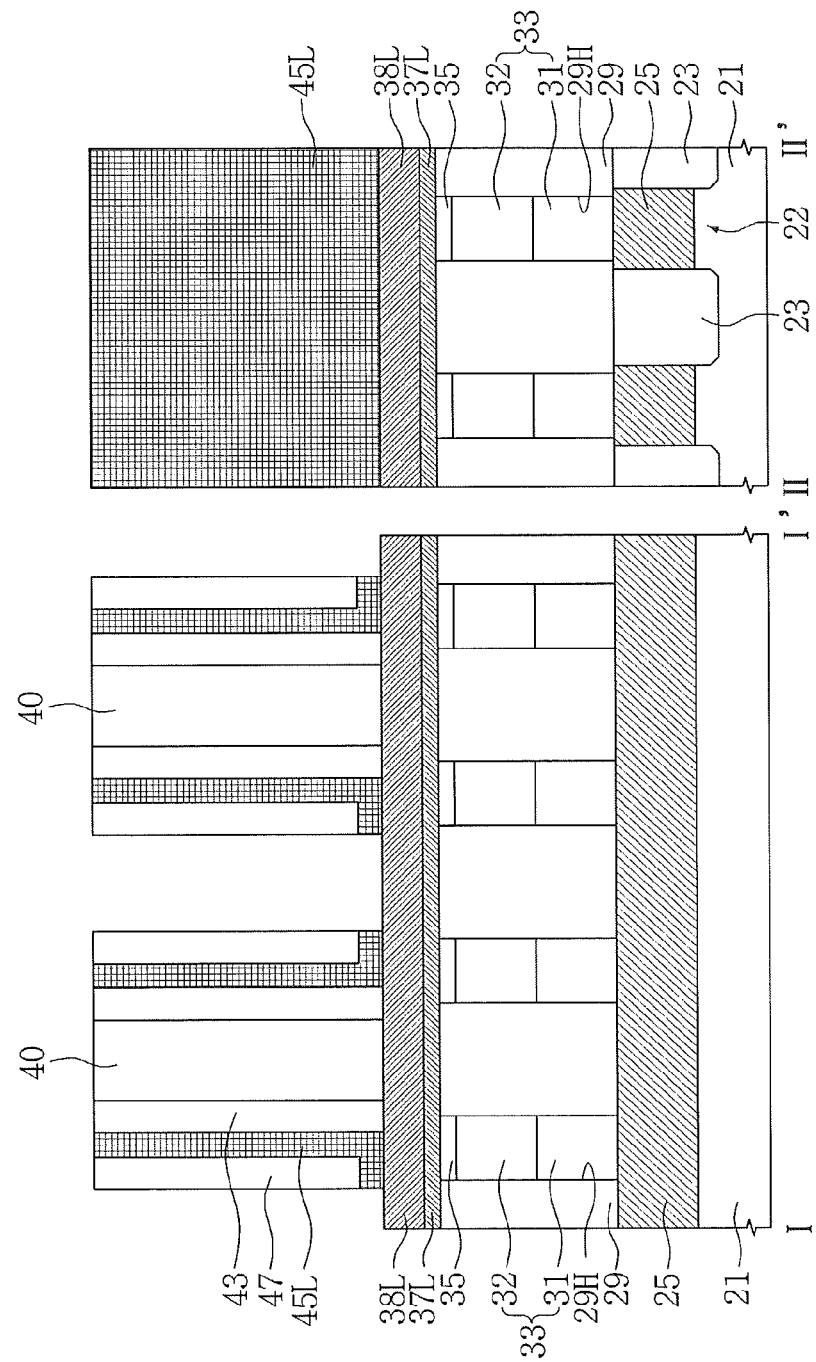

Referring to FIGS. 3 and 31, a first barrier metal layer 37L and a conductive layer 38L may be sequentially formed on the metal silicide pattern 35 and the molding layer 29. The first barrier metal layer 37L may be in contact with the metal silicide pattern 35 and cover the molding layer 29. Sacrificial patterns 40 may be formed on the conductive layer 38L. The sacrificial pattern 40 may be bar-shaped. The sacrificial pattern 40 may be formed using a thin-layer forming process and a patterning process.

First spacers 43 may be formed on sidewalls of the sacrificial pattern 40. A lower heater 45L and second spacers 47 may be sequentially formed on outer lateral surfaces of the first spacers 43. The first spacers 43 and the second spacers 47 may include a material having an etch selectivity with respect to the sacrificial pattern 40. For example, the sacrificial pattern 40 may include silicon oxide, while the first and second spacers 43 and 47 may include silicon nitride. The first and second spacers 43 and 47 may be formed using a thin-layer forming process and an anisotropic etching process. The lower heater layer 45L may be formed using a thin-layer forming process and an etchback process. The etchback process may include an isotropic etching process and/or an anisotropic etching process. The sacrificial pattern 40, the lower heater layer 45L, the first spacers 43, and the second spacers 47 may be alternately formed on the conductive layer 38L several times.

Figure 32:
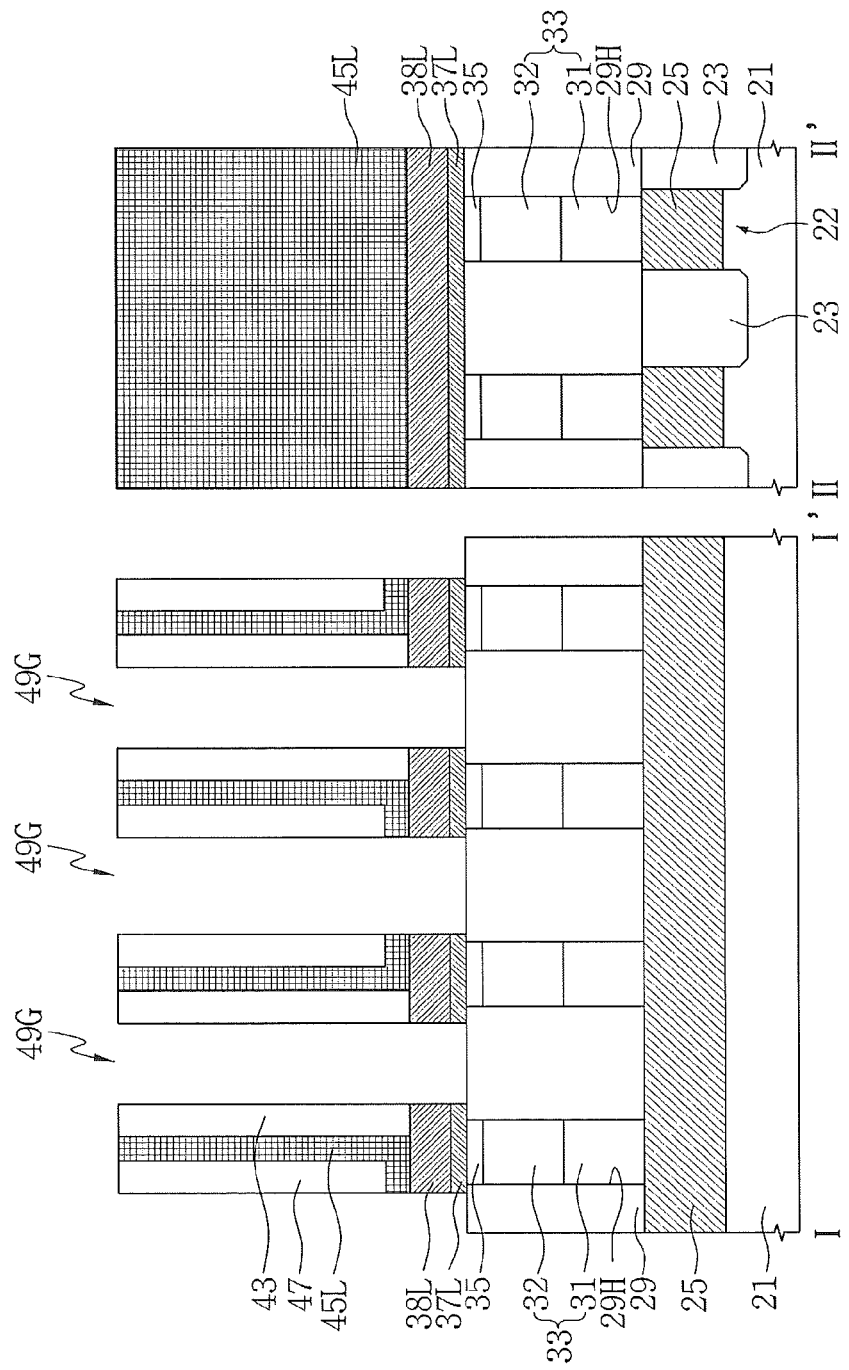

Referring to FIGS. 3 and 32, the sacrificial pattern 40 may be removed to expose the conductive layer 38L. The conductive layer 38L and the first barrier metal layer 37L may be anisotropically etched using the lower heater layer 45L, the first spacers 43, and the second spacers 47 as an etch mask, thereby forming first grooves 49G. The molding layer 29 may be exposed on bottoms of the first grooves 49G.

Figure 33:
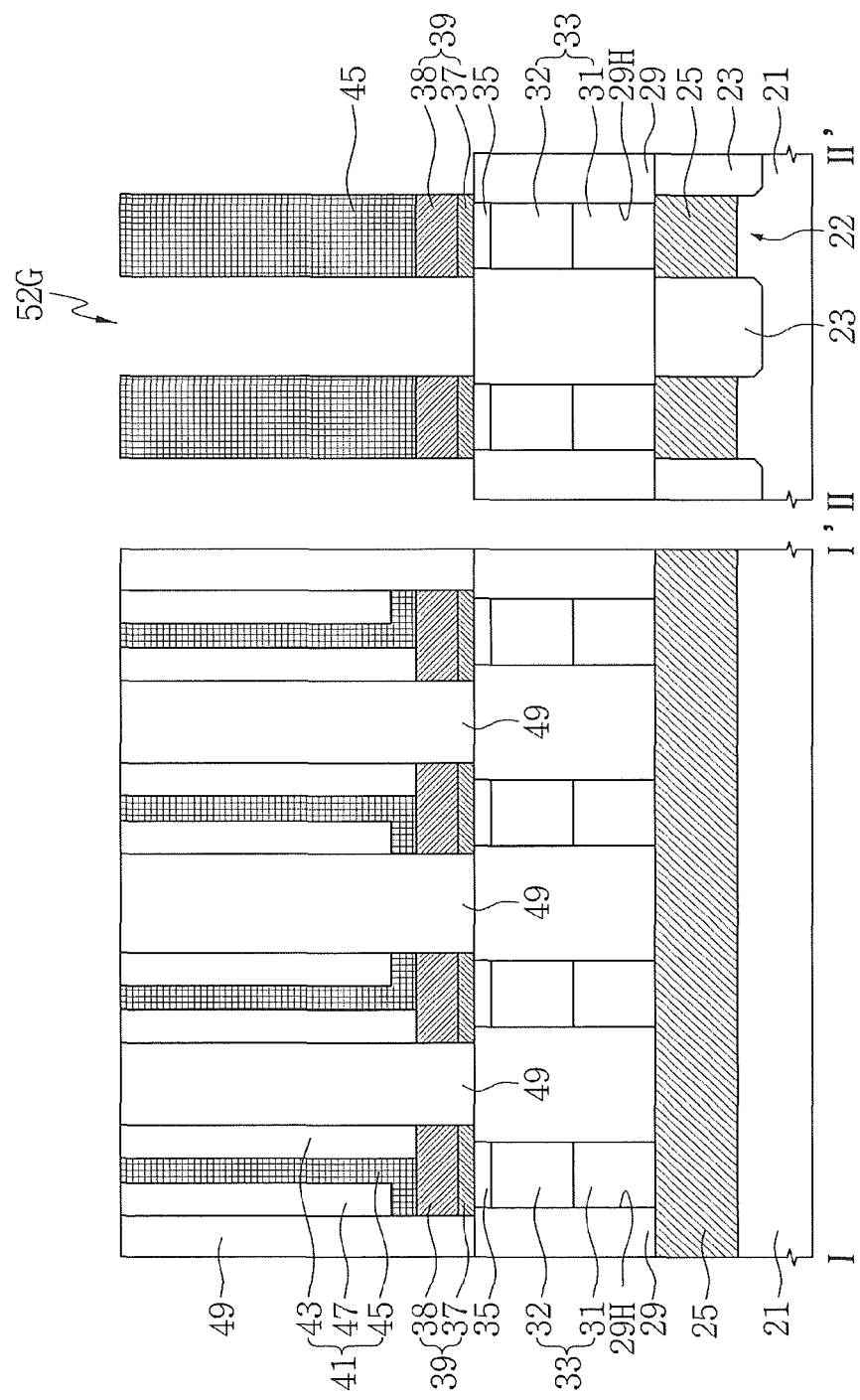

Referring to FIGS. 3 and 33, insulating patterns 49 may be formed to fill the first grooves 49G. The insulating patterns 49 may be formed using a thin-layer forming process and a planarization process. The insulating patterns 49 may include silicon oxide, silicon nitride, silicon oxynitride, or a combination thereof. For example, the insulating patterns 49 may include silicon nitride.

The insulating patterns 49, the first spacers 43, the lower heater layer 45L, the second spacers 47, the conductive layer 38L, and the first barrier metal layer 37L may be patterned, thereby forming second grooves 52G. The second grooves 52G may cross the first grooves 49G at right angles. In other words, the second grooves 52G may extend in a direction substantially perpendicular to that of the first grooves 49G. The molding layer 29 may be exposed at bottoms of the second grooves 52G. As a result, the lower heater layer 45L may be patterned to form lower heaters 45, and the conductive layer 38L may be patterned to form conductive patterns 38. Also, the first barrier metal layer 37L may be patterned to form first barrier metal patterns 37. The first barrier metal patterns 37 and the conductive patterns 38 may constitute or define lower pads 39.

Each of the lower heaters 45 may be retained between the first and second spacers 43 and 47. The lower heater 45, the first spacer 43, and the second spacer 47 may constitute or define an electrode structure 41. Each of the lower pads 39 may be self-aligned on the electrode structure 41. Lateral surfaces of the lower pad 39 may be vertically aligned on lateral surfaces of the electrode structure 41. In other words, sidewall surfaces of the lower pad 39 may be coplanar with sidewall surfaces of the electrode structure 41 thereon.

Figure 34:
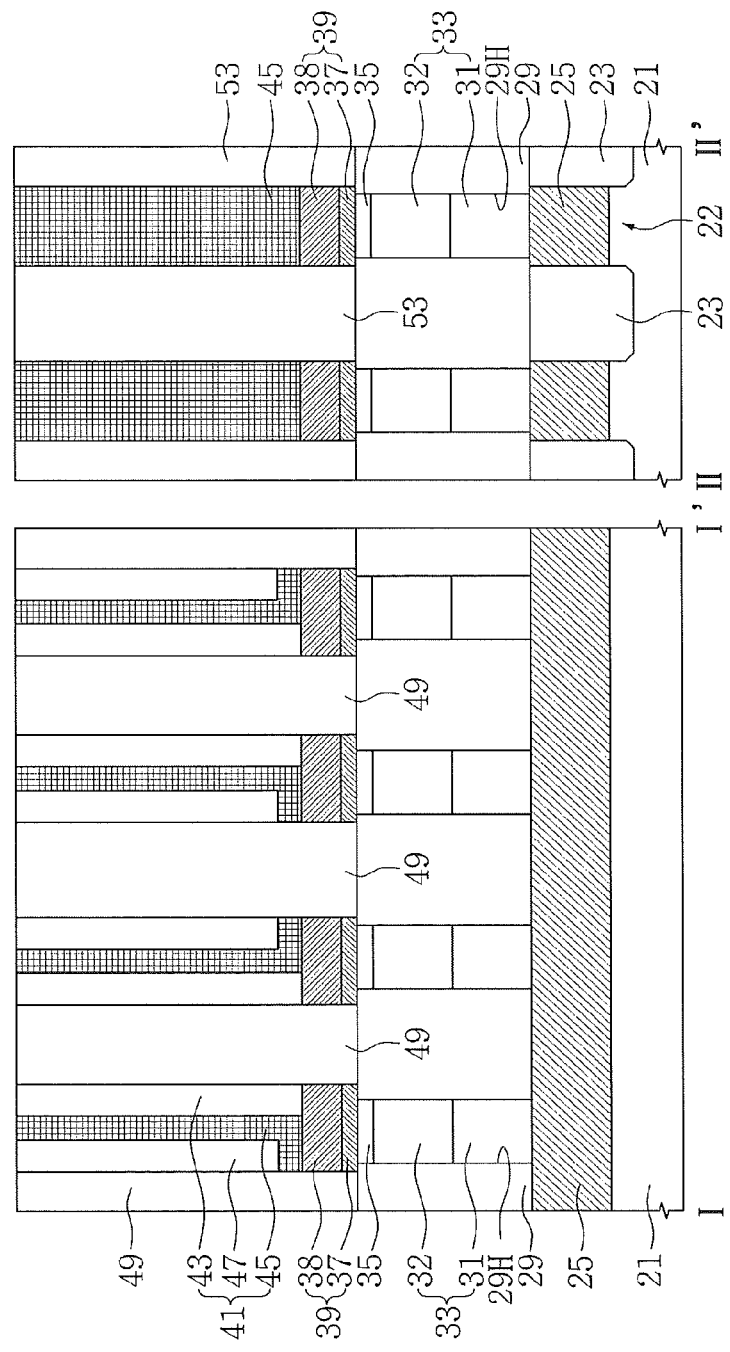

Referring to FIGS. 3 and 34, insulating lines 53 may be formed to fill the second grooves 52G. The insulating lines 53 may be formed using a thin-layer forming process and a planarization process. Top surfaces of the insulating lines 53, the electrode structures 41, and the insulating patterns 49 may be exposed on substantially the same plane surface (e.g., may be coplanar). The insulating lines 53 may be parallel to each other. The insulating lines 53 may cross the insulating patterns 49 at right angles. The insulating patterns 49 may be retained between the insulating lines 53. The insulating lines 53 may include silicon oxide, silicon nitride, silicon oxynitride, or a combination thereof. For example, the insulating lines 53 may include silicon nitride.

Figure 35:
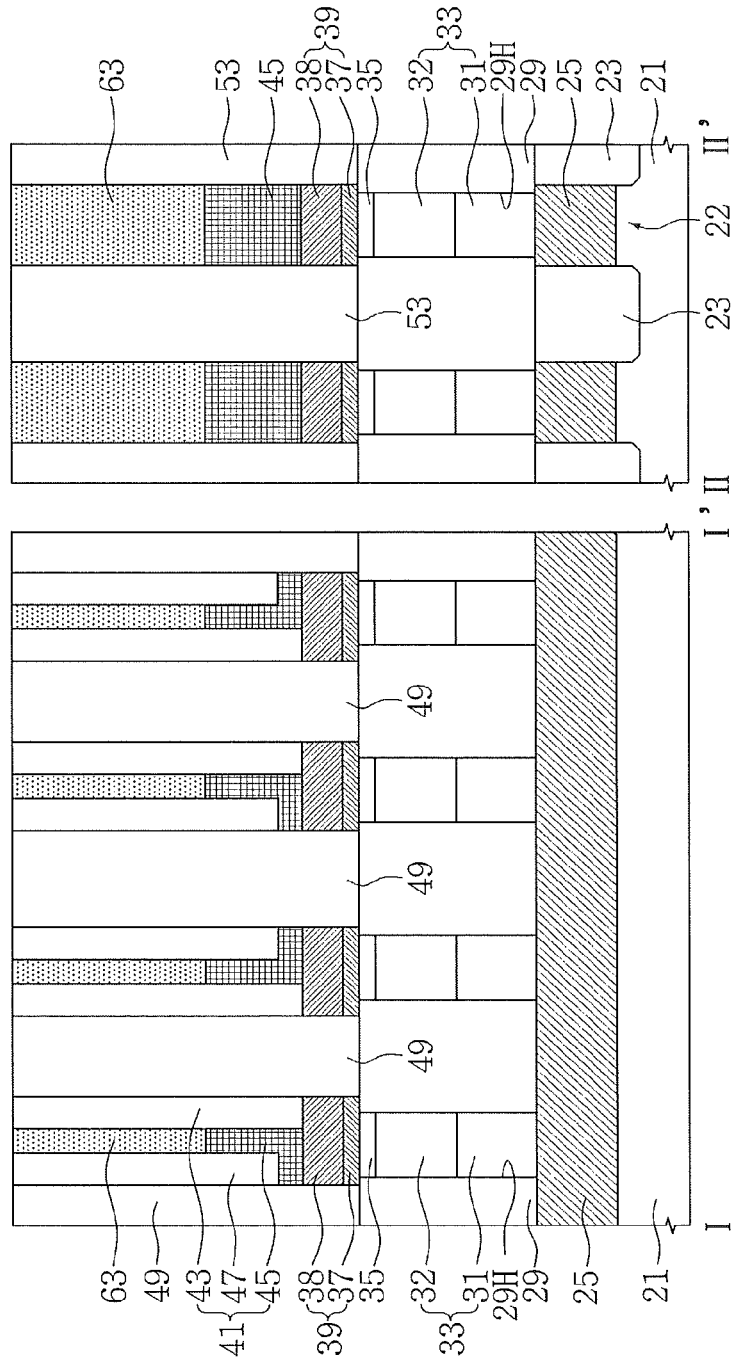

Referring to FIGS. 3 and 35, the lower heaters 45 may be partially removed to form trenches, and data storage patterns 63 may be formed to fill the trenches. The partial removal of the lower heaters 45 may be performed using an etchback process. The lower heaters 45 may be retained at a lower level than top ends of the first and second spacers 43 and 47.

The data storage patterns 63 may be formed using a thin-layer forming process and a planarization process. The data storage patterns 63 may be self-aligned on the lower heaters 45. Lateral surfaces of the data storage patterns 63 may be vertically aligned on lateral surfaces of the lower heater 45. The data storage patterns 63 may be defined between the first spacers 43 and the second spacers 47.

Figure 36:
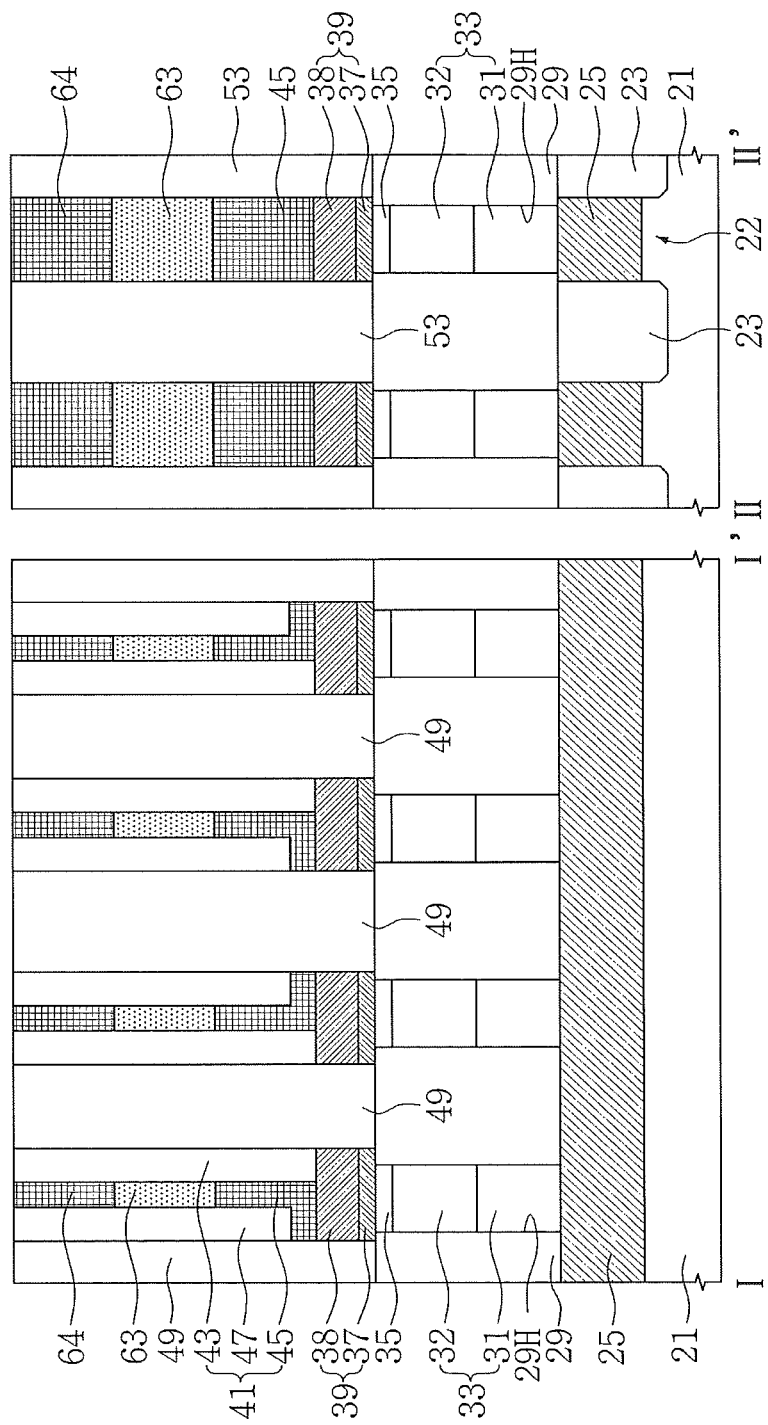

Referring to FIGS. 3 and 36, the data storage patterns 63 may be partially removed to form trenches, and upper heaters 64 may be formed to fill the trenches. The upper heaters 64 may be formed using a thin-layer forming process and a planarization process. Top surfaces of the upper heaters 64, the insulating lines 53, the insulating patterns 49, the first spacers 43, and the second spacers 47 may be exposed on substantially the same plane surface.

Figure 37:
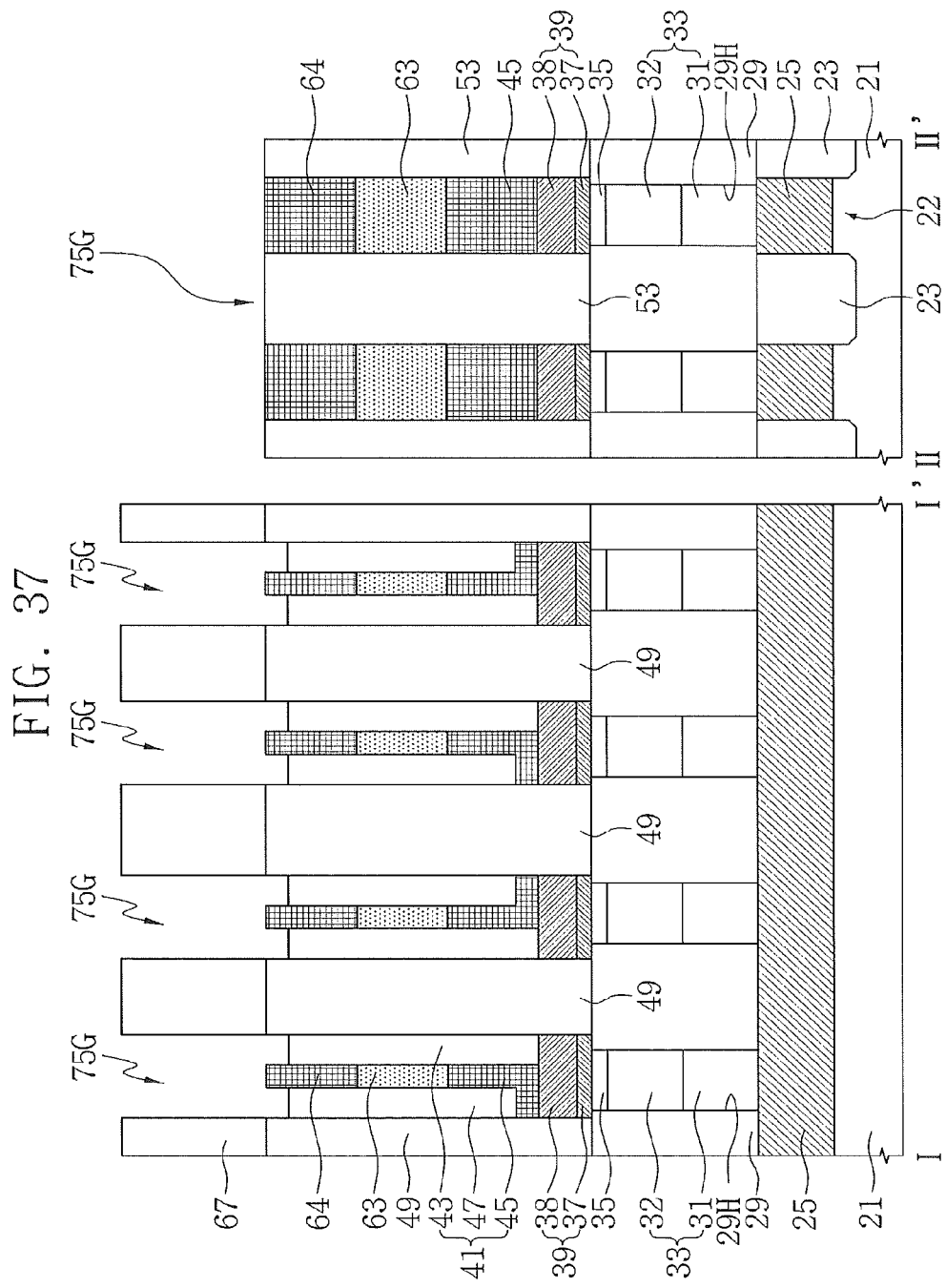

Referring to FIGS. 3 and 37, an upper insulating layer 67 may be formed to cover the upper heaters 64, the insulating lines 53, the insulating patterns 49, the first spacers 43, and the second spacers 47. Bit grooves 75G may be formed through the upper insulating layer 67 to expose the upper heaters 64. Top ends and lateral surfaces of the upper heaters 64 may be exposed by the bit grooves 75G. For example, top ends of the first and second spacers 43 and 47 may be recessed at a lower level than top ends of the insulating patterns 49 such that the upper surfaces thereof are no longer coplanar.

Referring back to FIGS. 3 and 12, bit lines 75 may be formed to fill the bit grooves 75G. Each of the bit lines 75 may include a second barrier metal pattern 71, a seed layer 72, and a bit conductive layer 73 stacked sequentially. The bit lines 75 may cover the top ends and lateral surfaces of the upper heaters 64. The top ends and lateral or sidewall surfaces of the upper heaters 64 may be in contact with the second barrier metal pattern 71.

Figure 38:
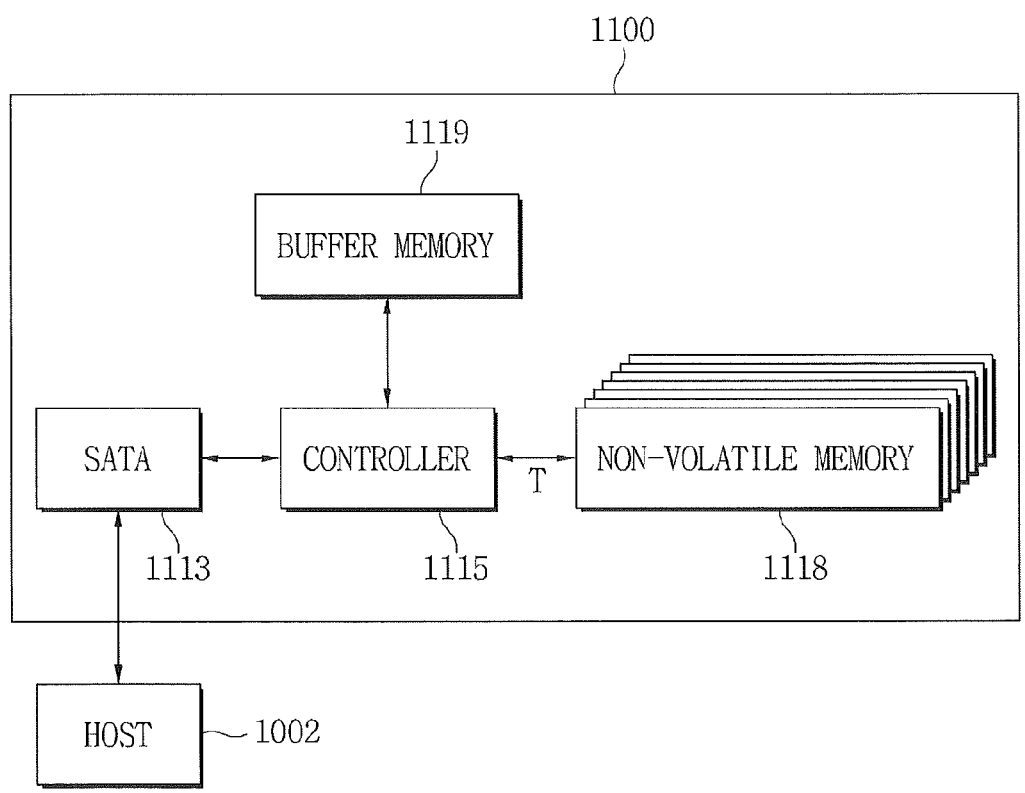
FIG. 38 is a system block diagram of an electronic device according to still yet further embodiments of the inventive concept.

FIG. 38 is a system block diagram of an electronic device according to still yet further embodiments of the inventive concept. The electronic device may be a data storage device, such as a solid-state disk (SSD) 1100.

Referring to FIG. 38, the SSD 1100 may include an interface (such as a SATA interface) 1113, a controller 1115, a non-volatile memory 1118, and a buffer memory 1119. The SSD 1100 may be a device configured to store information using semiconductor devices as described herein. As compared with a hard disk drive (HDD), the SSD 1100 may operate at high speed, reduce mechanical delay, failure rate, generation of heat, and noise, and be downscaled and made lightweight. The SSD 1100 may be used for laptop personal computers (laptop PCs), desktop PCs, MP3 players, or portable storage devices.

The controller 1115 may be formed adjacent and electrically connected to the interface 1113. The controller 1115 may be a microprocessor (MP) including a memory controller and a buffer controller. The non-volatile memory 1118 may be formed adjacent and electrically connected to the controller 1115. The SSD 1100 may have a data capacity corresponding to the non-volatile memory 1118. The buffer memory 1119 may be formed adjacent and electrically connected to the controller 1115.

The interface 1113 may be connected to a host 1002 and serve to transmit and receive electric signals, such as data. For example, the interface 1113 may be an apparatus using a standard, such as serial advanced technology attachment (SATA), integrated drive electronics (IDE), small computer system interface (SCSI), and/or a combination thereof. The non-volatile memory 1118 may be connected to the interface 1113 through the controller 1115. The non-volatile memory 1118 may function to store data received through the interface 1113. The non-volatile memory 1118 may be characterized by retaining the stored data even if power supplied to the SSD 1100 is interrupted.

The buffer memory 1119 may include a volatile memory device. The volatile memory device may be a dynamic random access memory (DRAM) and/or a static random access memory (SRAM). The buffer memory 1119 may operate at relatively higher speed than the non-volatile memory device 1118.

Data processing speed of the interface 1113 may be relatively higher than operation speed of the non-volatile memory device 1118. Here, the buffer memory 1119 may function to temporarily store data. After data received through the interface 1113 is temporarily stored in the buffer memory 1119 through the controller 1115, the received data may be permanently stored in the non-volatile memory 1118 at a data write speed of the non-volatile memory 1118. Also, among the data stored in the non-volatile memory 1118, frequently used data may be previously read and temporarily stored in the buffer memory 1119. That is, the buffer memory 1119 may function to increase effective operating speed of the SSD 1100 and reduce error rate.

The non-volatile memory 1118 may include non-volatile memory devices as described with reference to FIGS. 1 through 37. For example, the non-volatile memory device 1118 may include memory cells, which may have the same or similar configuration as shown in FIG. 1. In this case, the non-volatile memory 1118 may exhibit better or improved electrical properties than some conventional devices, due to the configurations of the lower heater 45 and the upper heater 64. Thus, electrical properties of the SSD 1100 may be improved.

Figure 39:
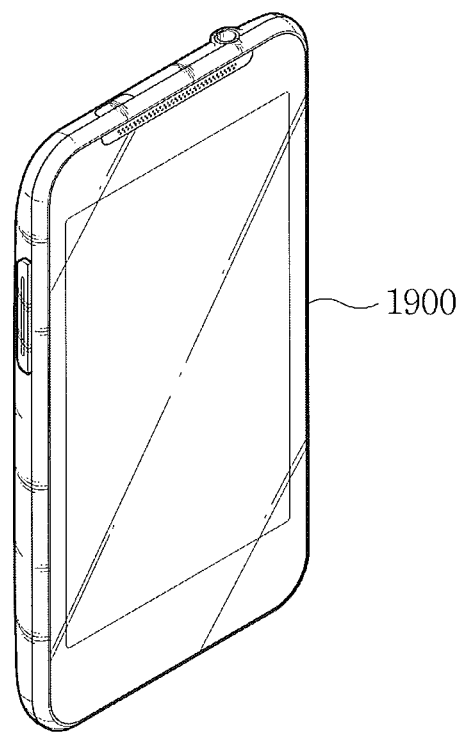
FIGS. 39 and 40 are, respectively, a perspective view and a system block diagram of an electronic device according to yet other embodiments of the inventive concept.
Figure 40:
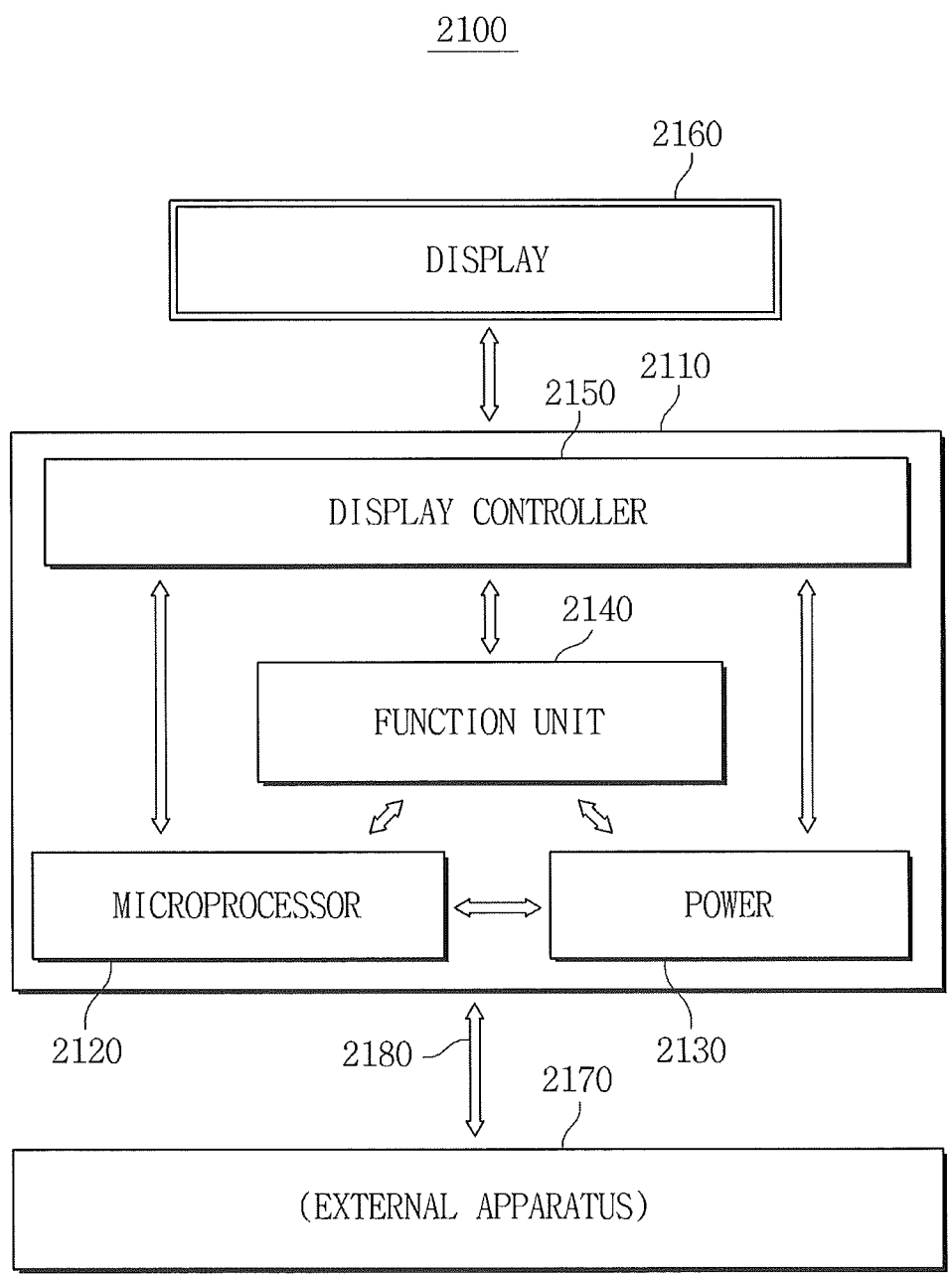

FIGS. 39 and 40 are, respectively, a perspective view and system block diagram of an electronic device according to yet other embodiments of the inventive concept.

Referring to FIG. 39, a non-volatile memory device, which is similar to those described with reference to FIGS. 1 through 37, may be effectively applied to electronic systems, such as a portable phone 1900, a netbook, a laptop computer, or a tablet PC. For instance, the non-volatile memory device, which is similar to those described with reference to FIGS. 1 through 37, may be mounted on a main board of the portable phone 1900. Furthermore, the non-volatile memory device, which is similar to those described with reference to FIGS. 1 through 37, may be provided to an expansion device, such as an external memory card, and combined with the portable phone 1900.

Referring to FIG. 40, the non-volatile memory device, which is similar to those described with reference to FIGS. 1 through 37, may be applied to an electronic system 2100. The electronic system 2100 may include a body 2110, a microprocessor (MP) unit 2120, a power unit 2130, a function unit 2140, and a display controller unit 2150. The body 2110 may include a mother board including a printed circuit board (PCB). The MP unit 2120, the power unit 2130, the function unit 2140, and the display controller unit 2150 may be mounted on the body 2110. The display unit 2160 may be disposed inside or outside the body 2110. For example, the display unit 2160 may be disposed on the surface of the body 2110 and display an image processed by the display controller unit 2150.

The power unit 2130 may function to receive a predetermined voltage from an external battery (not shown), divide the voltage into required voltage levels, and supply the divided voltages to the MP unit 2120, the function unit 2140, and the display controller unit 2150. The MP unit 2120 may receive a voltage from the power unit 2130, and control the function unit 2140 and the display unit 2160. The function unit 2140 may serve various functions of the electronic system 2100. For example, when the electronic system 2100 is a portable phone, the function unit 2140 may include several components capable of serving various functions of the portable phone, for example, outputting an image to the display unit 2160 or outputting a voice to a speaker, by dialing or communicating with an external apparatus 2170. When a camera is also mounted, the function unit 2140 may serve as a camera image processor.

In applied embodiments, when the electronic system 2100 is connected to a memory card to increase capacity, the function unit 2140 may be a memory card controller.

The function unit 2140 may transmit/receive signals to/from the external apparatus 2170 through a wired or wireless communication unit 2180. Furthermore, when the electronic system 2100 requires a universal serial bus (USB) to increase functionality, the function unit 2140 may serve as an interface controller. In addition, the function unit 2140 may include a mass storage device.

A non-volatile memory device, which is similar to those described with reference to FIGS. 1 through 37, may be applied to the function unit 2140. For example, the function unit 2140 may include the lower heater 45, the data storage pattern 63, and the upper heater 64. The data storage pattern 63 may be electrically connected to the body 2110. In this case, the electronic system 2100 may exhibit improved or better electrical properties than some conventional devices, due to the configuration of the lower and upper heaters 45 and 64. Thus, the electrical properties of the electronic system 2100 may be improved.

According to embodiments of the inventive concept, a non-volatile memory device in which a lower heater, a data storage pattern, and an upper heater are vertically aligned on one another can be provided. Since the lower and upper heaters are in contact with the data storage pattern, the non-volatile memory device according to the embodiments can exhibit better or improved heat emission/transmission characteristics than in the related art. As a result, a non-volatile memory device having excellent electrical properties can be embodied.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures.

What is claimed is:

1. A non-volatile memory device comprising:
   a data storage structure coupled between first and second conductive lines of the memory device, the data storage structure comprising a conductive lower heater element, a data storage pattern, and a conductive upper heater element sequentially stacked,
   wherein the data storage pattern includes a sidewall surface that is coplanar with a sidewall surface of the upper heater element and a sidewall surface of the lower heater element,
   wherein a surface of the lower heater element contacting the data storage pattern includes a protrusion along an edge thereof, and wherein a surface of the data storage pattern contacting the upper heater element includes a protrusion along an edge thereof.

2. The device of claim 1, wherein a contact area between the upper heater element and the data storage pattern is substantially equal to a contact area between the lower heater element and the data storage pattern.

3. The device of claim 2, further comprising:
   a first insulating pattern including a planar surface that contacts the sidewall surfaces of the lower heater element, the data storage pattern, and the upper heater element.

4. The device of claim 3, wherein the data storage pattern, the upper heater element, and the lower heater element include respective second sidewall surfaces opposite the respective first sidewall surfaces thereof, and wherein the second sidewall surface of the data storage pattern is coplanar with the second sidewall surface of the upper heater element and the second sidewall surface of the lower heater element.

5. The device of claim 4, further comprising:
   a second insulating pattern including a planar surface that contacts the second sidewall surfaces of the lower heater element, the data storage pattern, and the upper heater element, wherein the first and second insulating patterns define a trench therebetween including the data storage structure therein.

6. The device of claim 5, wherein the data storage pattern, the upper heater element, and the lower heater element respectively include third and fourth opposing sidewall surfaces, wherein the third sidewall surfaces are coplanar, and wherein the fourth sidewall surfaces are coplanar.

7. The device of claim 1, wherein at least one of the lower heater element or the upper heater element comprises a first portion including the sidewall surface thereof extending in a direction substantially perpendicular to a surface of an active region thereon, and a second portion extending in a direction substantially parallel to the surface of the active region.

8. The device of claim 1, further comprising:
   an upper conductive electrode between the upper heater element and the second conductive line,
   wherein the upper conductive electrode has a lower electrical resistance than the upper heater element and a higher electrical resistance than the second conductive line.

9. The device of claim 5, further comprising:
   a diode element between the first conductive line and the lower heater element; and
   a lower conductive pad between the diode element and the lower heater element,
   wherein a contact area between the lower conductive pad and the lower heater element is not less than a contact area between the lower conductive pad and the diode element.

10. The device of claim 9, wherein first and second opposing sidewall surfaces of the lower conductive pad are coplanar with sidewall surfaces of the first and second insulating patterns, respectively.

11. The device of claim 1, wherein an upper surface and a sidewall surface of the upper heater element electrically contact the second conductive line.

12. A non-volatile memory device comprising:
    a first conductive line on a substrate;
    a switching element on the first conductive line;
    a lower heater on the switching element;
    a data storage pattern on the lower heater;
    an upper heater on the data storage pattern; and
    a second conductive line on the upper heater,
    wherein a lateral surface of the upper heater is vertically aligned with a lateral surface of the lower heater and a lateral surface of the data storage pattern.

13. The device of claim 12, wherein a contact surface between the upper heater and the data storage pattern has a substantially same area as a contact surface between the lower heater and the data storage pattern.

14. The device of claim 12, wherein the lower heater, the data storage pattern, and the upper heater have a substantially same horizontal width.

15. The device of claim 12, wherein an edge of a top surface of the lower heater protrudes upward, and wherein an edge of a top surface of the data storage pattern protrudes upward.

16. The device of claim 12, further comprising a conductive pattern interposed between the switching element and the lower heater,
    wherein the lower heater comprises:
    an upper part having a vertical height greater than a horizontal width thereof; and
    a lower part having a horizontal width greater than a vertical height thereof,
    wherein the lower part of the lower heater is in contact with the conductive pattern.

17. A non-volatile memory device comprising:
    a first conductive line disposed on a substrate;
    a switching element disposed on the first conductive line;
    a lower heater disposed on the switching element;
    a data storage pattern disposed on the lower heater;
    a high-resistance pattern disposed on the data storage pattern;
    an intermediate resistance pattern disposed on the high-resistance pattern; and
    a second conductive line formed on the intermediate resistance pattern and crossing the first conductive line,
    wherein a lateral surface of the high-resistance pattern is vertically aligned with a lateral surface of the lower heater and a lateral surface of the data storage pattern, wherein the high-resistance pattern includes a material having a higher electrical resistance than that of the second conductive line, and wherein the intermediate resistance pattern includes a material having an electrical resistance higher than that of the second conductive line, and lower than that of the high-resistance pattern.

18. The device of claim 17, wherein the high-resistance pattern includes titanium silicon nitride (TiSiN), the intermediate resistance pattern includes TiN, and the second conductive line includes copper (Cu).

19. The device of claim 17, wherein the intermediate resistance pattern comprises:
   an upper electrode in contact with the high-resistance pattern; and
   a barrier metal pattern formed on the upper electrode and surrounding lateral and bottom surfaces of the second conductive line.

20. A non-volatile memory device comprising:
   a data storage structure coupled between first and second conductive lines of the memory device, the data storage structure comprising a conductive lower heater element, a data storage pattern, and a conductive upper heater element sequentially stacked,
   wherein the data storage pattern includes a sidewall surface that is coplanar with a sidewall surface of the upper heater element and a sidewall surface of the lower heater element, and wherein:
   at least one of the lower heater element or the upper heater element comprises a first portion including the sidewall surface thereof extending in a direction substantially perpendicular to a surface of an active region thereon, and a second portion extending in a direction substantially parallel to the surface of the active region; or
   the device further comprises an upper conductive electrode between the upper heater element and the second conductive line, wherein the upper conductive electrode has a lower electrical resistance than the upper heater element and has a higher electrical resistance than the second conductive line.

* * * * *